United States Patent [19]
Toshiyuki et al.

[11] Patent Number: 5,635,740
[45] Date of Patent: *Jun. 3, 1997

[54] SEMICONDUCTOR DEVICE AND METHOD OF MANUFACTURING THE SAME

[75] Inventors: Nagata Toshiyuki, Tsukuba; Yoshida Hiroyuki, Ryugasaki; Niuya Takayuki, Tsukuba; Ogata Yoshihiro; Boku Katsushi, both of Tsuchivra; Miyai Yoichi, Toride, all of Japan

[73] Assignee: Texas Instruments Incorporated, Dallas, Tex.

[*] Notice: The term of this patent shall not extend beyond the expiration date of Pat. No. 5,317,177.

[21] Appl. No.: 425,281

[22] Filed: Apr. 20, 1995

Related U.S. Application Data

[62] Division of Ser. No. 251,866, May 31, 1994, Pat. No. 5,470,778, which is a division of Ser. No. 889,323, May 27, 1992, Pat. No. 5,317,177.

[30] Foreign Application Priority Data

Jun. 7, 1991 [JP] Japan ............................ 3-163912

[51] Int. Cl.$^6$ ............................ H01L 27/108; H01L 29/76; H01L 29/94; H01L 31/119
[52] U.S. Cl. ............................ 257/30.5; 257/301
[58] Field of Search ............................ 357/309, 301, 357/532, 535

[56] References Cited

U.S. PATENT DOCUMENTS

| | | | |
|---|---|---|---|
| 4,672,410 | 6/1987 | Miura et al. | 357/23.6 |
| 4,673,962 | 6/1987 | Chatterjee et al. | 357/23.6 |
| 4,713,678 | 12/1987 | Womack et al. | 357/23.6 |
| 4,737,829 | 4/1988 | Morimoto et al. | 357/23.6 |
| 4,956,692 | 9/1990 | Ozaki et al. | 357/49 |
| 5,028,980 | 7/1991 | Teng | 357/51 |
| 5,103,276 | 4/1992 | Shen et al. | 357/23.6 |
| 5,109,259 | 4/1992 | Banerjee | 357/23.6 |
| 5,111,259 | 5/1992 | Teng et al. | 357/23.6 |
| 5,317,177 | 5/1994 | Nagata et al. | 257/301 |

FOREIGN PATENT DOCUMENTS

| | | |
|---|---|---|
| 60-128658 | 7/1985 | Japan . |
| 2-28968 | 1/1990 | Japan . |
| 2-59567 | 9/1990 | Japan . |

*Primary Examiner*—Stephen D. Meier
*Attorney, Agent, or Firm*—Ira S. Matsil; James C. Kesterson; Richard L. Donaldson

[57] ABSTRACT

A semiconductor storage device is disclosed herein. A semiconductor substrate 1 has a first conductive type. A first groove is provided in this semiconductor substrate 1. A second groove 20, which is deeper than the first groove, is provided so as to be stacked within the first groove. A MOS transistor which include first and second regions 22 and 23 is connected to an accumulating electrode 133. The accumulating electrode 133 is disposed in the second groove 20 and separated from it by an insulating film 124. An electrode 143 is provided on the accumulating electrode 133 and separated therefrom by a capacitor insulating film 135. The electrode 143 is buried in the first and second grooves.

6 Claims, 20 Drawing Sheets

SEMICONDUCTOR DEVICE AND METHOD OF MANUFACTURING THE SAME

This is a division of application Ser. No. 08/251,866, filed May 31, 1994 now U.S. Pat. No. 5,470,778 which is a division of Ser. No. 07/889,323 filed May 27, 1992 now U.S. Pat. No. 5,317,177.

The present invention relates to a semiconductor device, such as a dynamic RAM (Random Access Memory), and a method for manufacturing it.

PRIOR ART

Conventionally, in a semiconductor integrated circuit device, such as a dynamic RAM, as shown in the memory unit of FIG. 31, for example, a trench-shaped groove (20) of a prescribed depth is formed on one side of a p-type silicon substrate (specifically, a p$^-$-type well (1) formed on a silicon substrate). This groove (20) is covered with an insulating film (25) and then filled with an n$^+$-type polysilicon (field plate) (43).

Next, an n$^+$-type diffusion area (34), which is diffusion-formed on the entire outside surface of the groove (20), is used as an electrode in forming a capacitor $C_1$. In addition, an n$^+$-type source area (33), which is linked to the n$^+$-type diffusion area (34), and an n$^+$-type drain area (22), which is connected to a bit line, are diffusion-formed on the other surface of the groove (20) in a prescribed pattern. A gate electrode (35), which serves as a word line, is situated in between these areas via a gate oxide film (17), thereby connecting an n-channel insulation gate field effect transistor (transfer gate) $Tr_1$, which is used in horizontal transmission. The source and drain areas are divided by a nitride film, with which a side wall technology is used.

The top (43a) of the field plate (43) projects above the groove (20), and is insulated and isolated from the bottom by the nitride film (51). In addition, it is insulated and isolated from the top by an SiO$_2$ film (52).

This field plate (43) is used as the electrode (ground side) of the aforementioned capacitor, and also provides an isolation action for preventing the generation of parasitic channels on the surface of the substrate immediately below it. However, studies carried out by these inventors have made it clear that with the aforementioned type of structure, as the degree of integration is increased, it becomes impossible to divide the source areas or the drain areas, and it is sometimes impossible to position the word line (35) itself as desired. This will be explained below with reference to the manufacturing procedures shown in FIGS. 32–39.

Specifically, as shown in FIG. 32, the nitride film (51) is deposited to the surface of the well (1) to be isolated from it by an SiO$_2$ film (50). After it is coated and exposed into a prescribed pattern, the nitride film (51) or resist is used as a mask in etching the substrate (1). Thus, a trench-shaped groove (20), having a depth in the range of 3–5 μm when used for a 64 megabite product, is formed on the substrate (1) in the memory cell unit.

Next, a commonly known method is used to diffusion-form an n-type impurity (such as As) on the walls of the groove (20), thereby forming an n$^+$ diffusion area (34), which is used for storing the capacitor electrode. Next, CVD (chemical vapor phase deposition method) or a thermal oxidation method is used to form SiO$_2$ film (25) on the walls of the groove (20) to a thickness of approximately 100Å.

Next, as shown in FIG. 33, the CVD method is used to deposit an n-type polysilicon (43) over the entire surface, including the groove (20), thereby forming a photoresist (93) in the prescribed pattern on only the prescribed areas (capacitor area).

Next, as shown in FIG. 34, the resist (93) is used as a mask in wet etching and then the polysilicon (43) is etched by dry etching. During this procedure, parts of all of the films below are etched. An area (90), in which the polysilicon (43) is not present, becomes the transistor formation area.

Next, as shown in FIG. 35, the surface of the polysilicon layer (43) is oxidized by a thermal oxidation technology, thereby growing an SiO$_2$ layer (52). During this process, since the SiO$_2$ layer (52) is grown such that after growth it will protrude somewhat into the periphery, before the following procedure (before the polysilicon (35) is deposited), Si$_3$N$_4$ is deposited over the entire surface and etching back technology is used to adhere the Si$_3$N$_4$ film (57) shown in FIG. 31 around the SiO$_2$ layer (52).

Specifically, as shown in FIG. 36, CVD is used to deposit an Si$_3$N$_4$ film (57), then etching back is used to selectively adhere the Si$_3$N$_4$ film (57) to the circumstance of the SiO$_2$ layer (52), as shown in FIG. 31. Thus, when a hood structure (95), resulting from the protrusion of the aforementioned SiO$_2$ layer (52), is formed, and a polysilicon (35) used for gates is adhered as shown in FIG. 31, this polysilicon reaches even below the aforementioned hood structure and thus remains unetched during gate patterning, thereby making it possible to prevent short-circuits between adjoining word lines.

However, in actual practice, since the aforementioned hood structure (95) protrudes considerably in the horizontal direction as shown in FIG. 35, it may remain as shown in FIG. 37 even if etching back of nitride film is carried out, since the following nitride film (57) is deposited to completely bury the area (90) as shown in FIG. 36.

In this case, it is not possible to form the area (90), serving as a transistor, according to the design (in particular, it is not possible to remove the nitride (51) by etching). Thus, it is impossible to form the following gate oxide film (17) and form the polysilicon gate (35), while it is impossible to form the transistor.

In relation to this issue, a particular problem is the fact that the oxidation shown in FIG. 35 causes the top of the polysilicon (43) to expand in volume, thus expanding outward horizontally. This becomes a more serious problem as the degree of integration is increased to reduce transistor size.

In addition, another problem occurs during the formation of the field plate (43), which is adjacent to adjoining capacitors as shown in FIG. 38, which shows a cross section different from that in FIG. 31, wherein if the patterning mask (93) of the polysilicon layer (43) shifts in position, as shown by the dotted and dashed line, from the proper position in the alternate long and short dash line, then the polysilicon (43) following the etching procedure will be thinner in the graded area (43b), as shown by the alternate long and short dash line.

Due to this phenomenon, and due to the fact that the diameter of the groove (20) is reduced as the cell size is reduced, precision in the polysilicon patterning becomes more difficult to obtain, thus further increasing the likelihood of the phenomenon. In addition, in the worst cases, the polysilicon (43) may cause line cutting, and even if this does not occur, the polysilicon (43b), which is allowed to remain in the following oxidation procedure (FIG. 39) as shown by the imaginary line, becomes completely oxidized, thus forming SiO$_2$ (52).

As a result, there is the risk that even the field plate (43) will cease to function, which is another serious problem along with the aforementioned problems.

OBJECT OF THE INVENTION

An object of the present invention is to offer a semiconductor device and manufacturing method for with which it is possible to form the desired areas according to designs and which is effective in preventing line cutting, etc., and flattening the surface.

Specifically, the present invention relates to a semiconductor device that is characterized by containing the following:

a first depression, which is formed on the surface of a semiconductor substrate;

a second depression, which is formed to be continuous with the first depression and to be deeper than the first depression;

a conductor, which is buried in the first and second depressions;

and an insulating film, which is formed on top of the conductor;

wherein the interface between the insulating film and the conductor is formed inside the first depression.

In addition, the present invention also offers:

a method for manufacturing a semiconductor device comprising the steps of:

forming a first depression on the surface of a semiconductor substrate;

forming a second depression to be linked with the first depression and to be deeper than the first depression;

burying a conductor in the first and second depressions to a level which is lower than the outermost surface of the semiconductor substrate surface;

forming an insulating film on top of the conductor.

Figure 1:
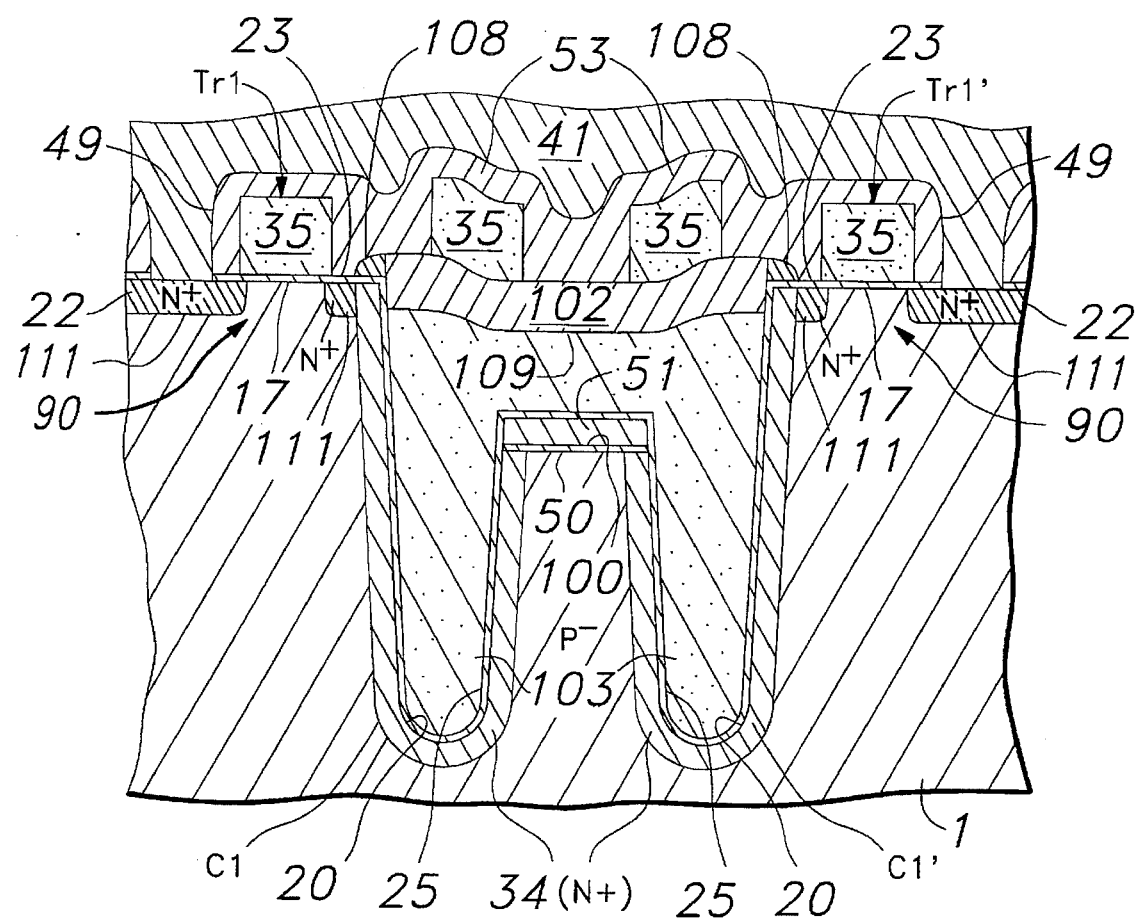
FIG. 1 is a cross section of the major parts of memory cells in the dynamic RAM of the first embodiment of the present invention (cross section of the line A—A in FIG. 4).

In reference numerals as shown in the drawings:
1. Substrate (p⁻-type well)
17. Gate oxide film
20. Trench-shaped groove
22, 23, 33, 34. n⁺-type diffusion areas
25, 50. SiO₂ films
35. Polysilicon gate electrode (word line)
41. Bit line
51. Nitride film
90. Gate active area
100. Depression
100a. Surrounding wall
102. SiO₂ layer
103. Polysilicon field plate
108. Si₃N₄ layer (side wall)
110. Depletion layer
111. pn junction
Tr₁, Tr'. Transfer gates
C₁, C₁'. Capacitors
W. Channel width

DESCRIPTION OF THE PREFERRED EMBODIMENTS

FIGS. 1-4 show a dynamic RAM (such as a 64 megabyte RAM) produced in the first embodiment of the present invention.

Figure 2:
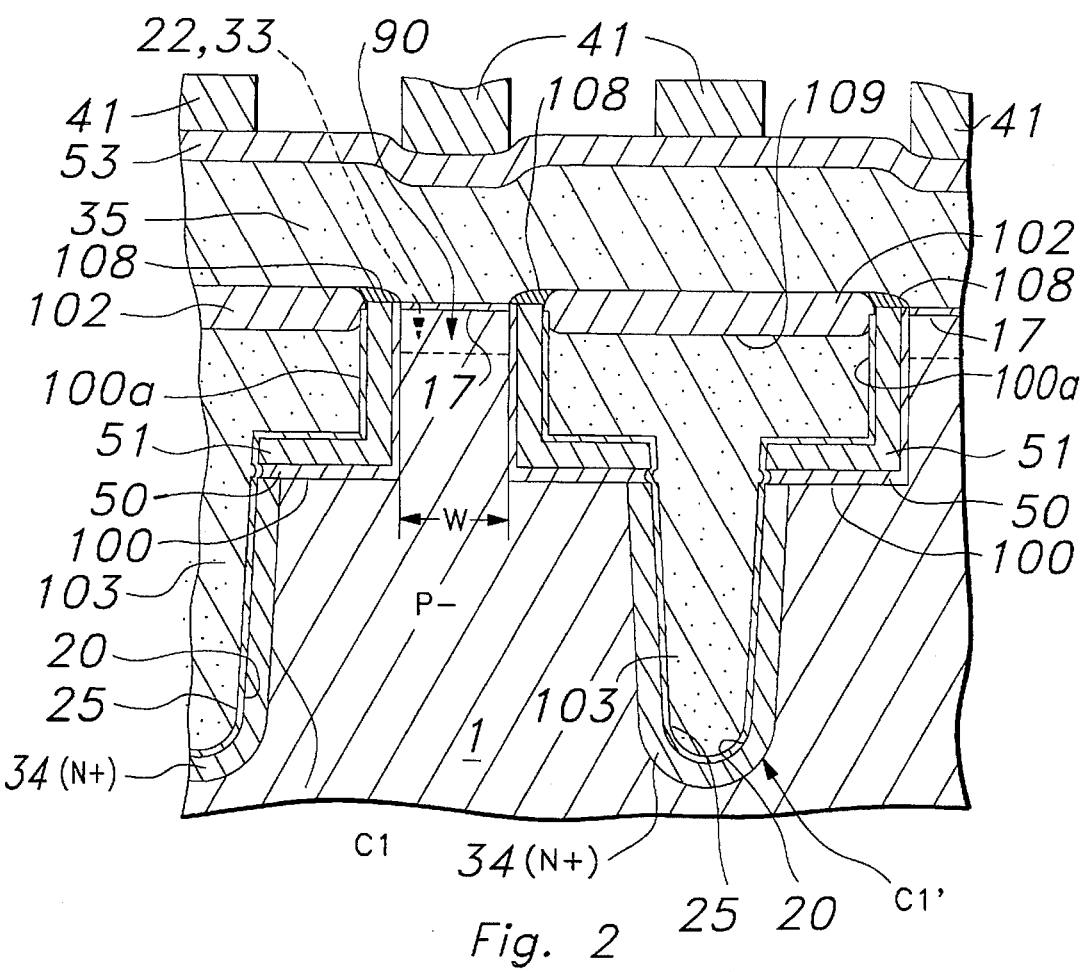
FIG. 2 is another cross section of the same memory cell unit (cross section of the line B—B in FIG. 4).
Figure 3:
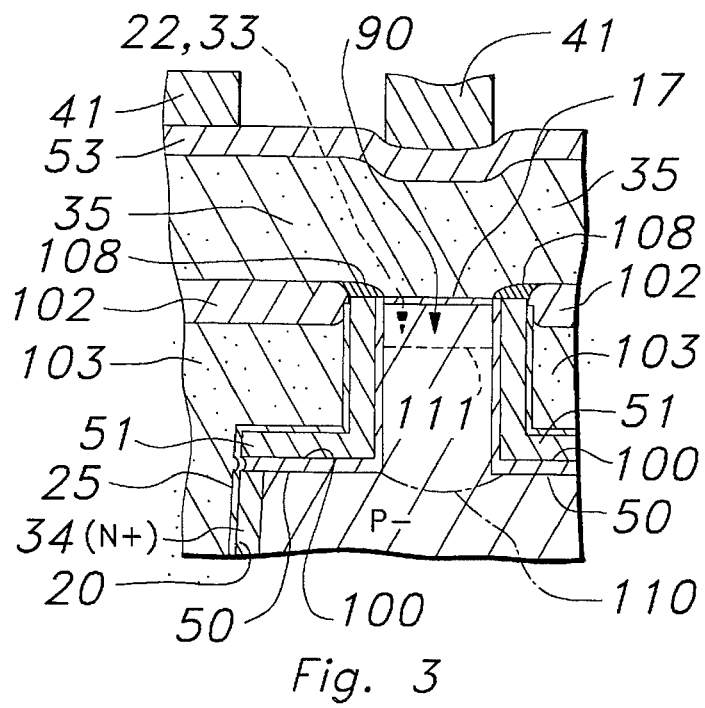
FIG. 3 is a cross section which shows part of FIG. 2.
Figure 4:
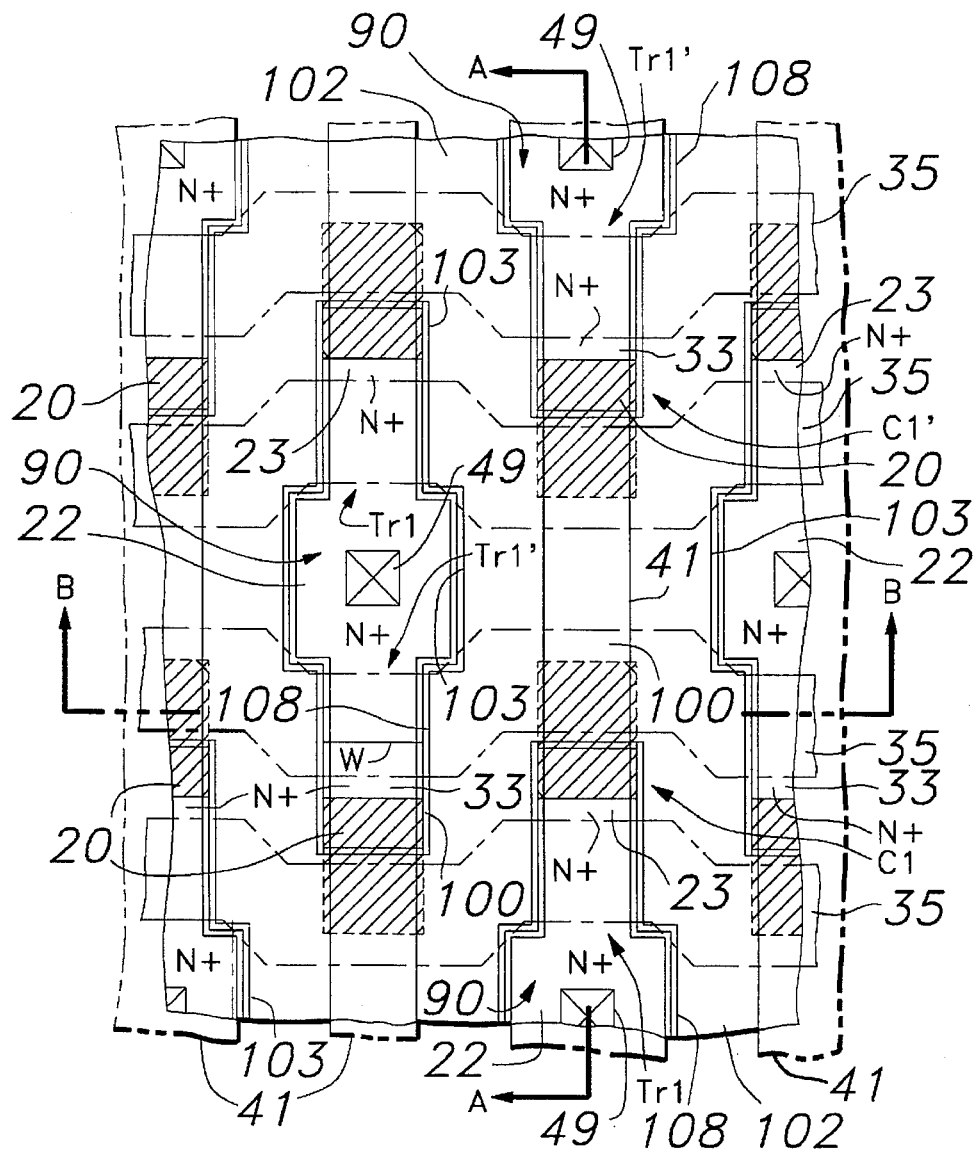
FIG. 4 is a plan view of the same memory cell unit.

FIG. 1 is a cross section which shows adjoining memory cells (cross section of the line A—A in FIG. 4). FIG. 2 is a cross section along the word line (cross section of the line B—B in FIG. 4). FIG. 3 shows part of FIG. 2.

With the dynamic RAM of the present example, the memory cells comprise of a single transistor-single capacitor structure, comprising transfer gates $Tr_1$ and $Tr_1'$, which are composed of n-channel insulation gate field effect transistors; and capacitors $C_1$ and $C_1'$, which are connected to the source areas (23) and (33) of these transfer gates. The capacitors $C_1$ and $C_1'$ are connected in common for adjoining cells (see FIG. 1).

Next, a trench-shaped groove (20) (shown by the diagonal lines in FIG. 4) of a prescribed depth is formed on one side of a p⁻-type silicon substrate (specifically, a p⁻-type well (1) formed on a silicon substrate). This groove (20) is covered with an insulating film (25) and then filled with an n⁺-type polysilicon (field plate) (103).

In this case, the area next to the top of the groove (20) (especially the area away from the memory cell active area (90)) is removed to form a depression (100) which is continuous with the groove (20) (or to the contrary, the groove (20) is formed to be continuous with the depression (100)). The polysilicon field plate (103) is then buried in this depression (100) and groove (20) (which is a depression that is much deeper than the depression (100)). Thus, the field plate (103) is present in a position below the surface of the memory cell active area (90). In addition, a polysilicon oxide (102) has a thickness of approximately 2500Å, and protrudes upward slightly from the aforementioned surface.

A film (108), having nitride as the main component, is applied to the oxide (102) by a side wall technology. It has the same functions as (57) described above. As will be explained below, this nitride film (108) is designed such that the memory cell active area (90) can be properly divided according to designs.

Next, the n⁺ diffusion area (34), which is diffusion-formed on the entire outside of the groove (20), is used in forming the capacitors $C_1$ and $C_1'$. In addition, n⁺-type source areas (23) and (33), which are linked to the n⁺-type diffusion area (34), and an n⁺-type drain area (22), which is connected to a bit line (41) (such as a polysilicon layer), are diffusion-formed on the other surface of the groove (20). Gate electrodes (35), which serve as word lines, are situated in between these areas via a gate oxide film (17), thereby connecting the n-channel insulation gate field effect transistors (transfer gates) $Tr_1$ and $Tr_1'$, which are used in horizontal transmission.

Two transfer gates ($Tr_1$, $Tr_1'$) are installed in one cell area in the memory cell array unit as shown in FIG. 4. A bit line (41) is installed to be common to both of these.

The capacitors $C_1$–$C_1'$ are connected to each other between cells by a field plate (103). The bottom of this field plate is insulated and isolated by an SiO₂ film (50) and Si₃N₄ film (51). In addition, its top is insulated and isolated by an SiO₂ film (102).

The word lines (35) of the other transfer gate are situated on top of the SiO₂ film (102). The SiO₂ (102) is deposited to an Si₃N₄ film (108) on the cell array unit side.

In addition, an SiO₂ layer (53) is deposited on top of the word lines (35), serving as an interlayer insulating film which isolates the bit line (41) and word lines (35) from each other. The bit line (41) and n⁺-type region (22) are connected to each other via a contact hole (49).

With the memory cell unit thus constructed, the depression (100) is formed to be continuous with the trench-shaped groove (20). The polysilicon layer (103), which serves as a field plate, is buried in this depression (100) and groove (20), and an SiO₂ layer (102) is then formed on top of it. Thus, when the polysilicon layer (103) is subjected to an oxidation treatment during the formation of the SiO₂ layer (102), the surrounding wall (100a) of the depression (100) (see FIG. 2) prevents the SiO₂ layer (102) from growing horizontally. Thus, the interface (109) between the SiO₂ layer (102) and polysilicon layer (103) is formed inside the depression (100).

As a result, since it is possible to form an Si₃N₄ layer (107) by a side wall technology in the following procedure, it is possible to secure the transfer gate active area (90) according to designs. Thus, this active area (90) is already secured during the formation of the aforementioned depression (100), thereby making it possible to carry out the procedures with precision and according to designs.

In addition, since the polysilicon layer (103) is buried at a level lower than the upper surface of the gate active area (90), even when the SiO₂ layer (102) is grown by oxidation, the polysilicon layer (103) will be connected between the cells over a sufficient cross section area, as shown in FIG. 1. Thus, there will be no wire cutting in the polysilicon layer (103). During this process, it is easy to bury the polysilicon layer (103) at the prescribed level before growing the oxide layer (102) using an etching back technology to be described below. Since it is not necessary to use a mask in performing etching, as prior art, it is possible to allow the polysilicon layer (103) to remain between the two cells over a sufficiently large cross section area at all times.

In addition, since there is not a large difference in level between the upper surface of the SiO₂ layer (102) and the gate active area (90), the surface is flatter than in the conventional structure (see FIG. 31) and it is easier to form wiring, etc. Thus, it is possible to prevent the problems of cutting wires.

Figure 31:
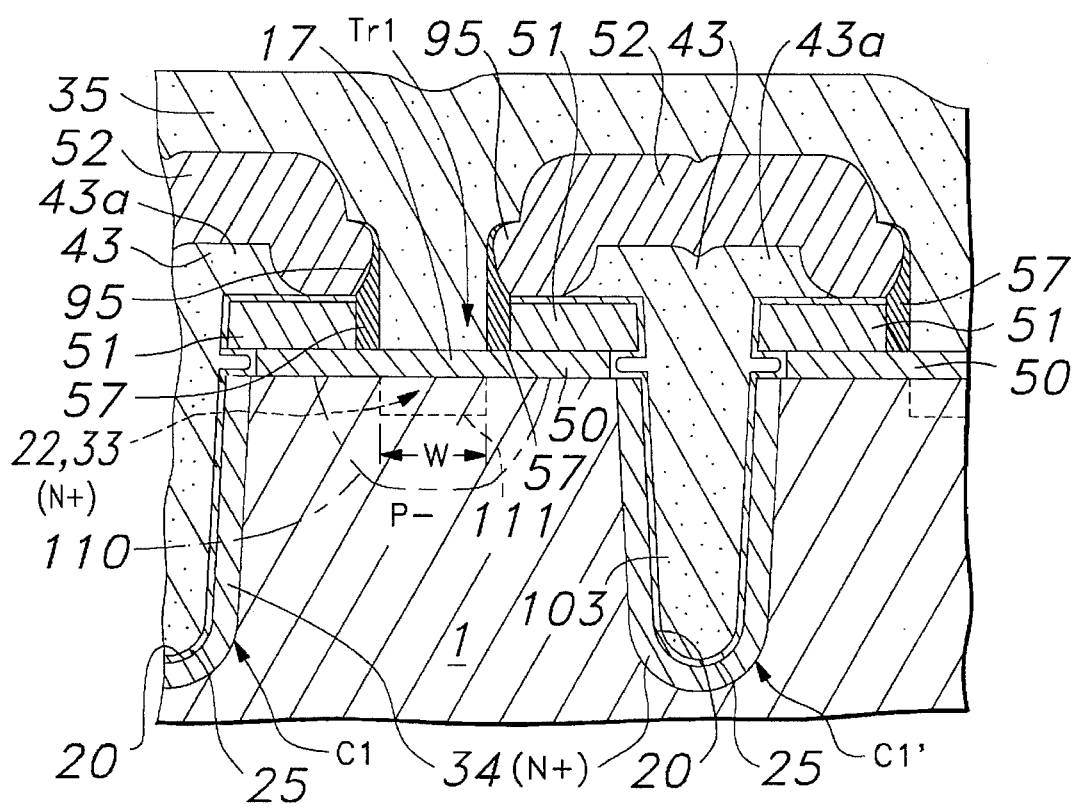
FIG. 31 is a cross section of the major parts of memory cells in the dynamic RAM of a conventional example.
Figure 32:
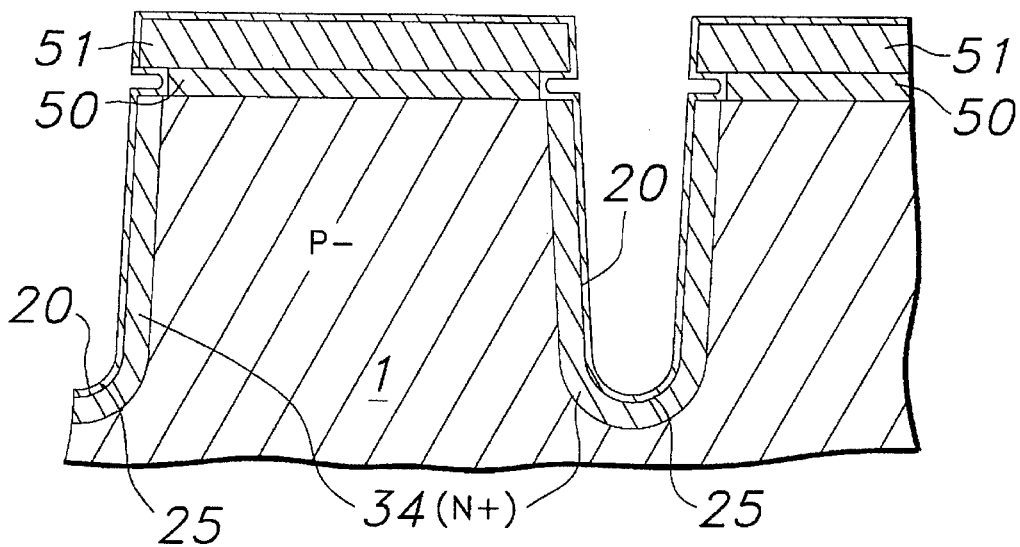
FIG. 32 is a cross section which shows a step in the method for manufacturing the aforementioned RAM in relation to the memory cells.
Figure 33:
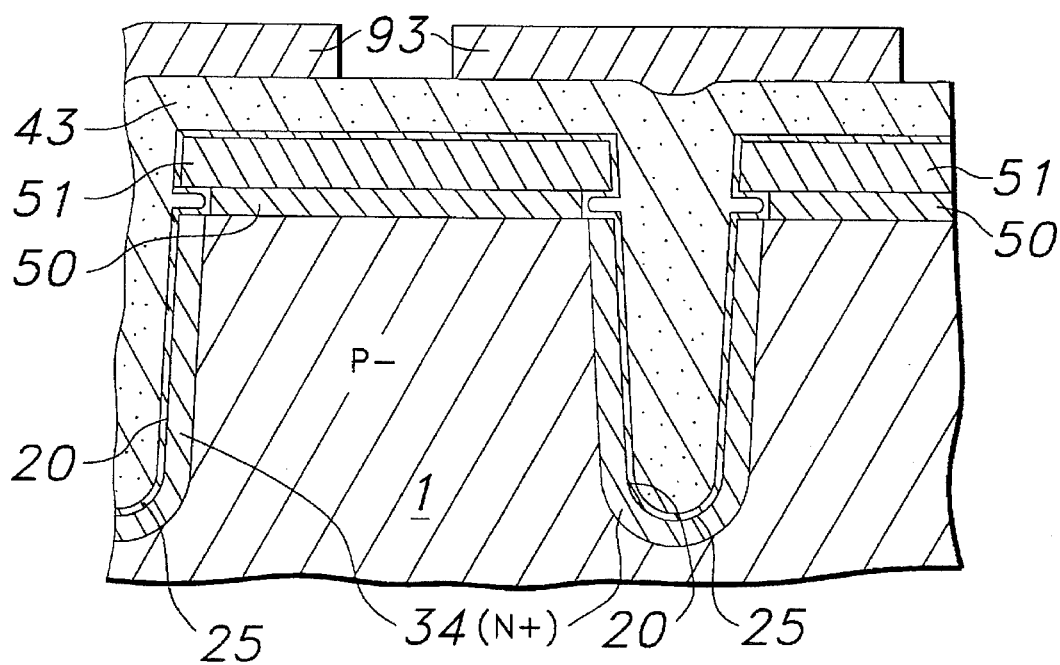
FIG. 33 is a cross section which shows a step in the method for manufacturing the aforementioned RAM in relation to the memory cells.
Figure 34:
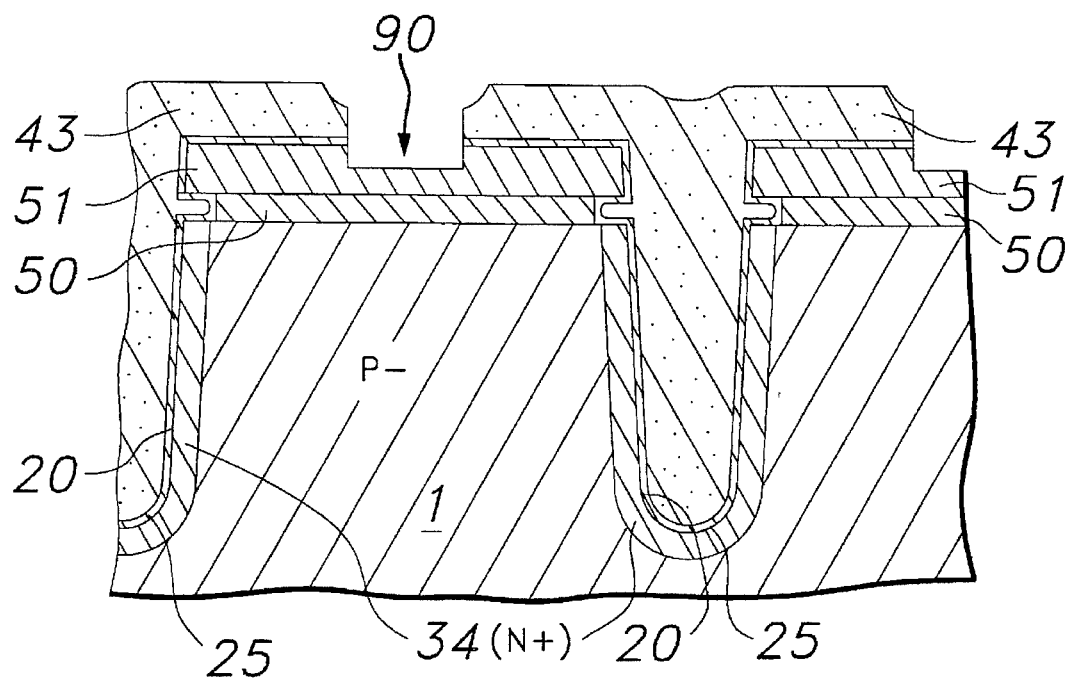
FIG. 34 as a cross section which shows a step in the method for manufacturing the aforementioned RAM in relation to the memory cells.
Figure 35:
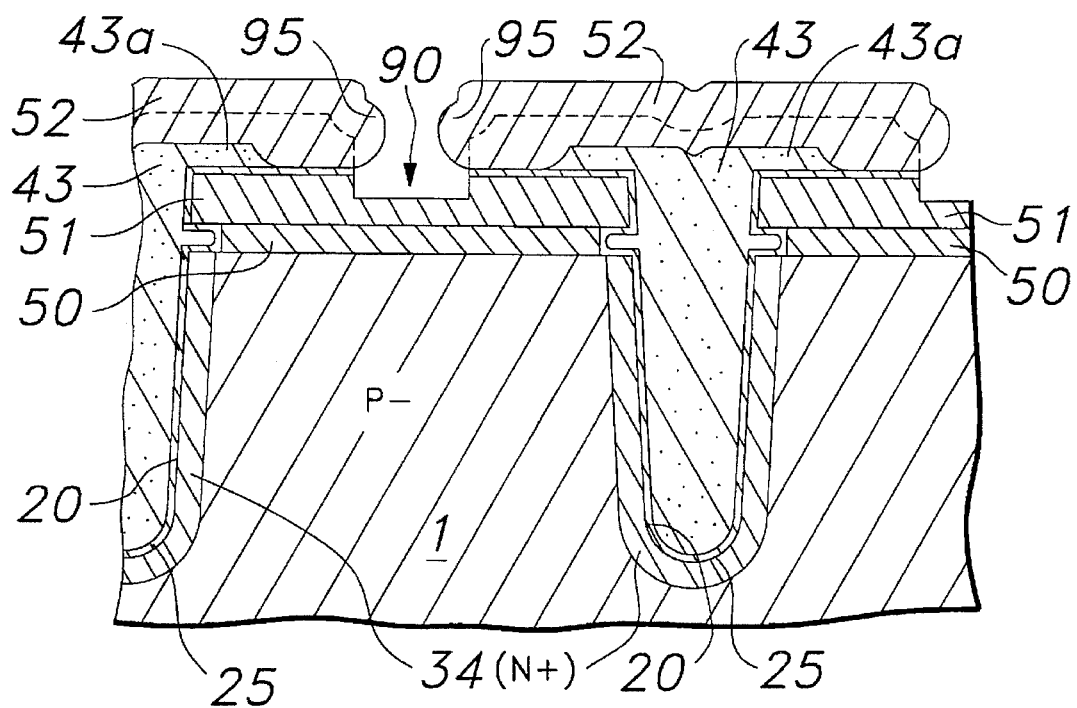
FIG. 35 is a cross section which shows a step in the method for manufacturing the aforementioned RAM in relation to the memory cells.
Figure 36:
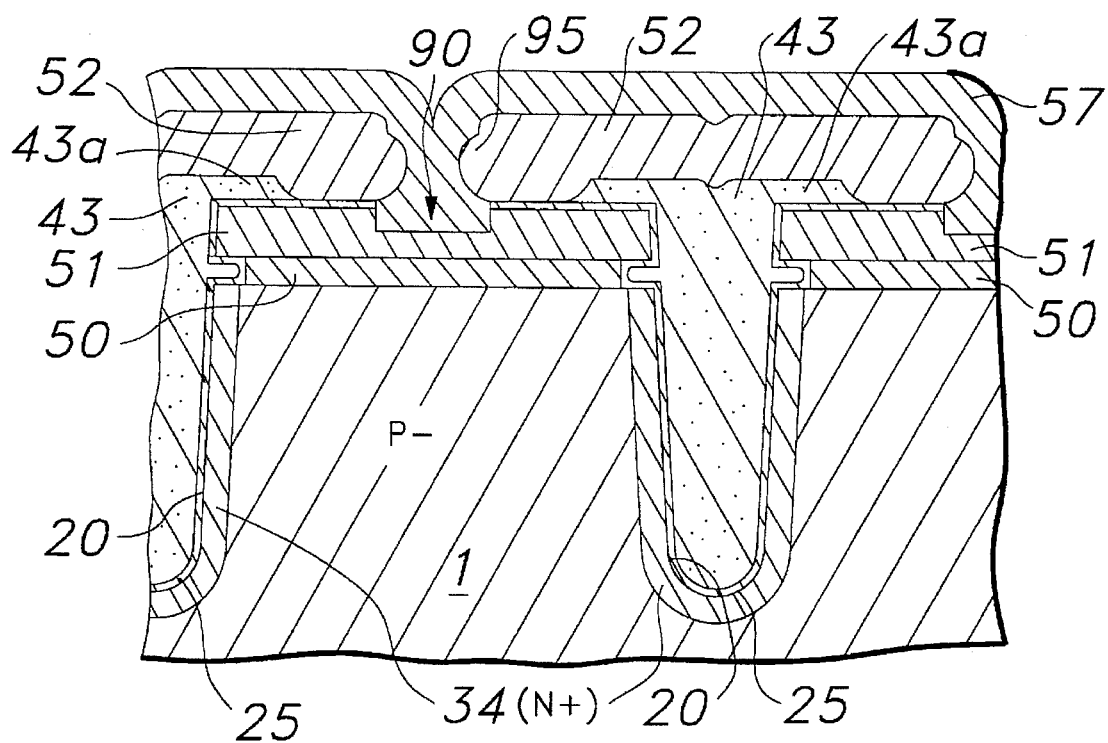
FIG. 36 as a cross section which shows a step in the method for manufacturing the aforementioned RAM in relation to the memory cells.
Figure 37:
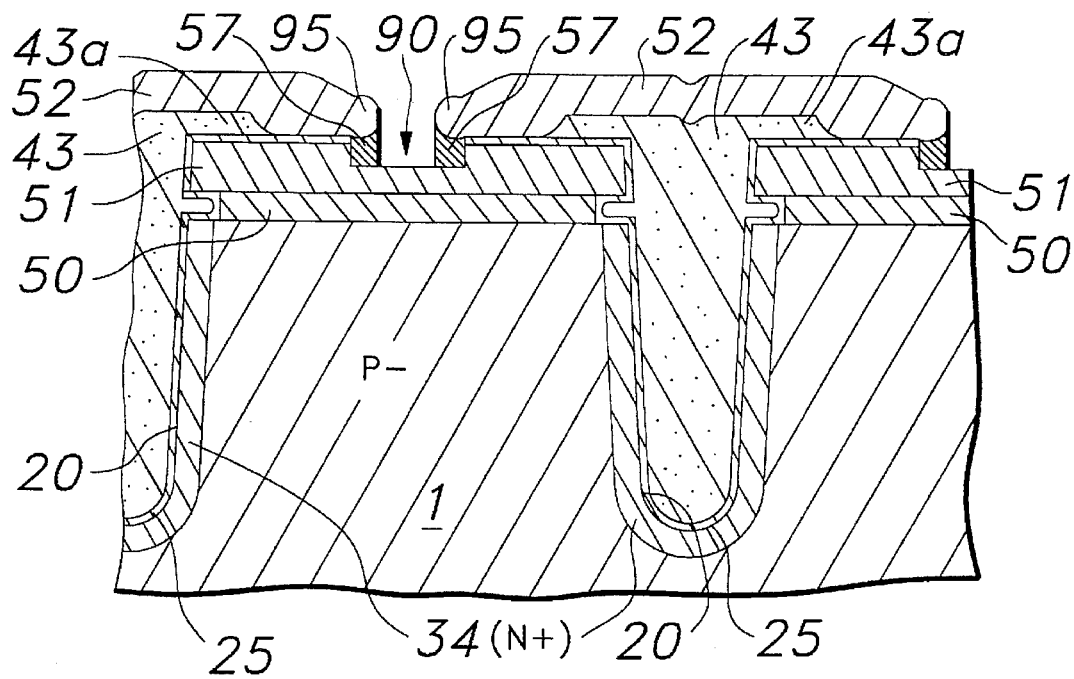
FIG. 37 is a cross section which shows a step in the method for manufacturing the aforementioned RAM in relation to the memory cells.
Figure 38:
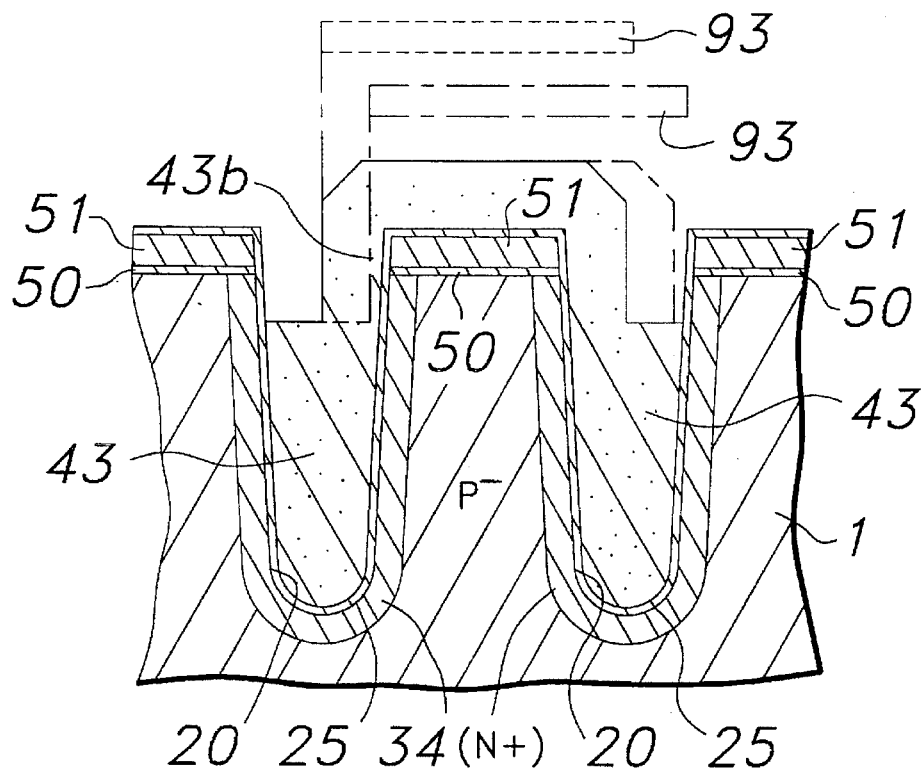
FIG. 38 is a cross section which shows a step in the method for manufacturing the aforementioned RAM in relation to the memory cells.
Figure 39:
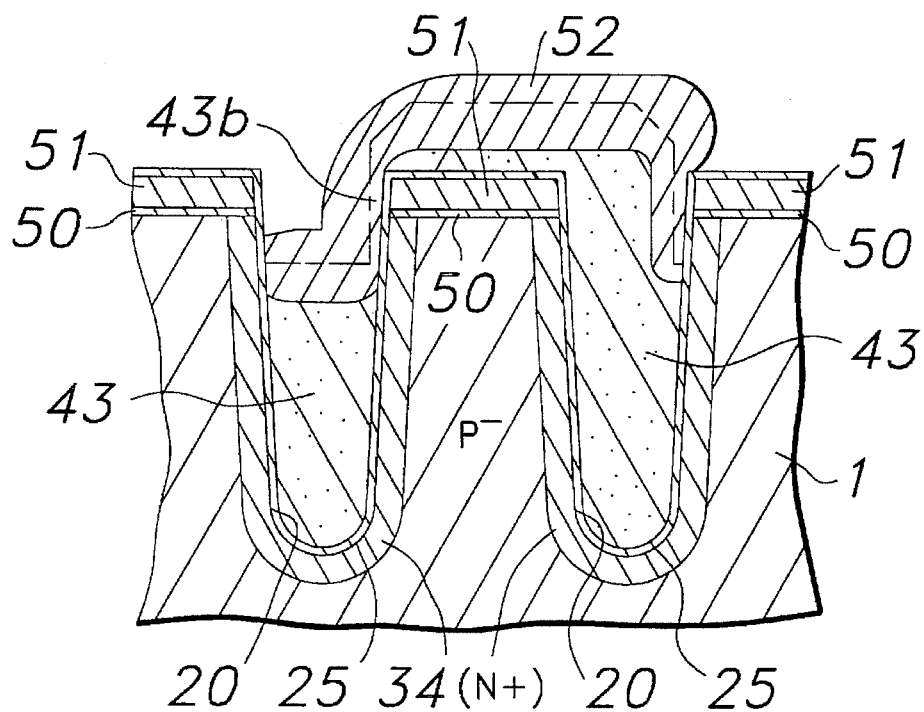
FIG. 39 is a cross section which shows a step in the method for manufacturing the aforementioned RAM in relation to the memory cells.

In addition, as shown in FIGS. 2 and 4, since the gate width W is determined according to designs, it is difficult for the so-called narrow channel effect to occur. Specifically, with the conventional structure as shown in FIG. 31, a pn junction (111), formed by the n⁺-type diffusion areas (22) and (33) and the well (1), is also present in the side areas. Thus, when the gate width W is reduced by the increased degree of integration, the depletion layer (110) increases the rate of expansion like a fictitious line when voltage is applied to the gate (35). Thus, it becomes difficult to apply gate voltage in the channel areas, which increases the threshold voltage. In contrast, with the structure of the present example as shown in FIG. 3, the gate width is limited to the space of the aforementioned depression (100) (thus making it possible to set the gate width according to plans, allowing the n⁺-type areas (22) and (33) to be divided within the same width, so that the pn junction (111) does not exist on the sides). Thus, it seems that the depletion layer (110) will only expand in a limited area, making it possible to reduce the threshold voltage below that of the conventional technology.

In order to obtain the above effects, the depth of the aforementioned depression (100) (specifically, the distance between the surface of the gate active area and the nitride film (51)) should be set to 3000–6000Å. In addition, the depth of the groove (20) is set to 3–5 μm.

In order to obtain the aforementioned effects, the depth of the depression (100) should be set to 3000Å or greater. If it is less, then the depression (or level difference) starting at the surface of the gate active layer will be too small, thereby weakening the aforementioned effects. In addition, the polysilicon (103) located above the depression will be thin, which tends to increase the resistance of the field plate (103) between the cells (see FIG. 1).

On the other hand, when the depression (100) is deep, the aforementioned effects are easily obtained, and during the formation of the polysilicon layer (103), it will be easy for the polysilicon to grow evenly from the bottom and sides of the depression, thereby making it possible to form a polysilicon layer (103) with a flat upper surface, which was confirmed by simulation. Thus, the depth of the depression (100) should be set to 3000Å or greater, but it is not necessary to make it too deep; it is practical to set is to less than 1 μm.

Next, the method for manufacturing the device of the present example will be explained with reference to FIGS. 5–24. FIGS. 5–14 correspond to FIG. 1, and FIGS. 15–24 correspond to FIG. 2.

Figure 5:
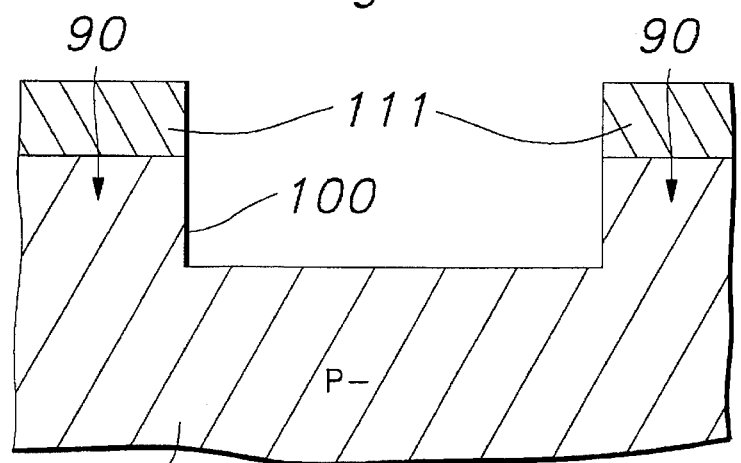
FIG. 5 is a cross section which shows a step in the method for manufacturing the aforementioned RAM in relation to the memory cells.
Figure 15:
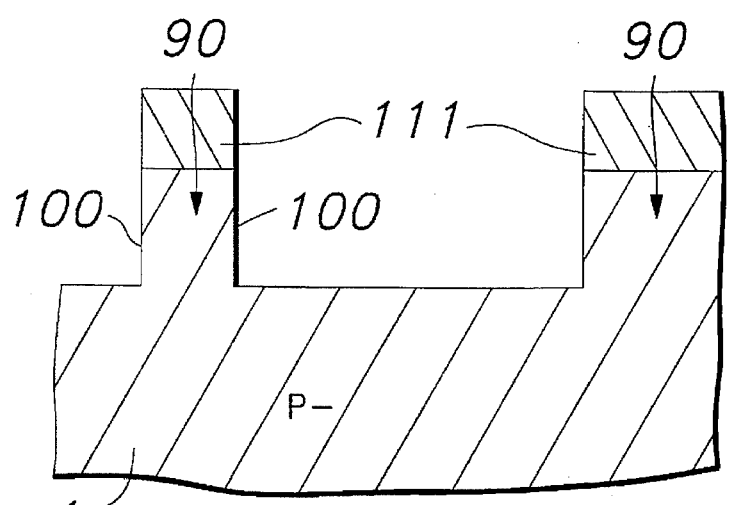
FIG. 15 is a cross section which shows a step in the method for manufacturing the aforementioned RAM in relation to the memory cells.

In the initial step of the procedures, as shown in FIGS. 5 and 15, p-type impurities (such as B) are ion-injected in the memory cell array unit to form a p⁻-type well (1) on one surface of the p⁻-type substrate.

Next, the gate active area (90) is covered with the photoresist (111), which has been given a prescribed pattern, and dry etching is carried out by RIE (reactive ion etching) to form the depression (100) over the field gate formation area to a depth of 3000–6000Å.

Figure 6:
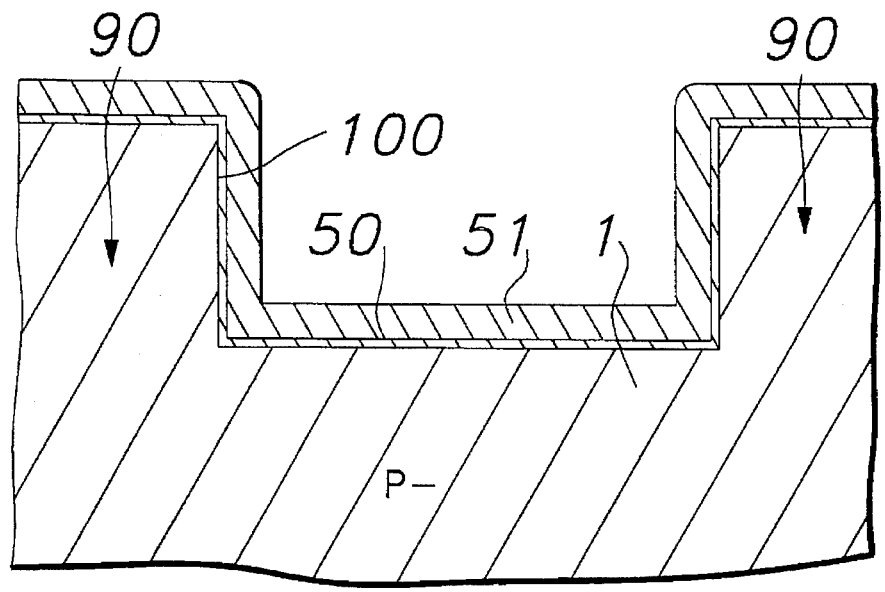
FIG. 6 is a cross section which shows a step in the method for manufacturing the aforementioned RAM in relation to the memory cells.
Figure 16:
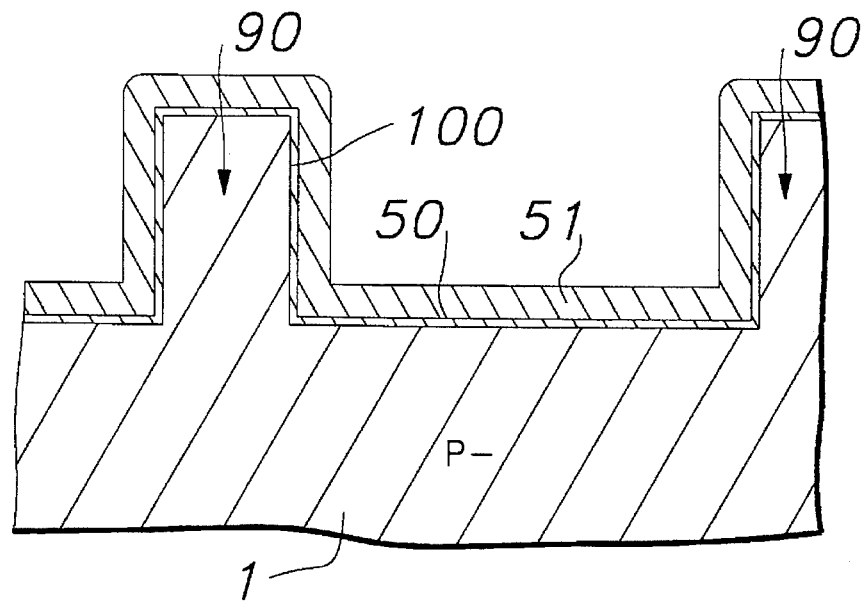
FIG. 16 is a cross section which shows a step in the method for manufacturing the aforementioned RAM in relation to the memory cells.

Next, as shown in FIGS. 6 and 16, the resist (111) is removed, after which a thin oxide film (50) is grown by thermal oxidation, and the Si₃N₄ film (51) is grown by CVD, on the surface, including the area of the depression (100).

Figure 7:
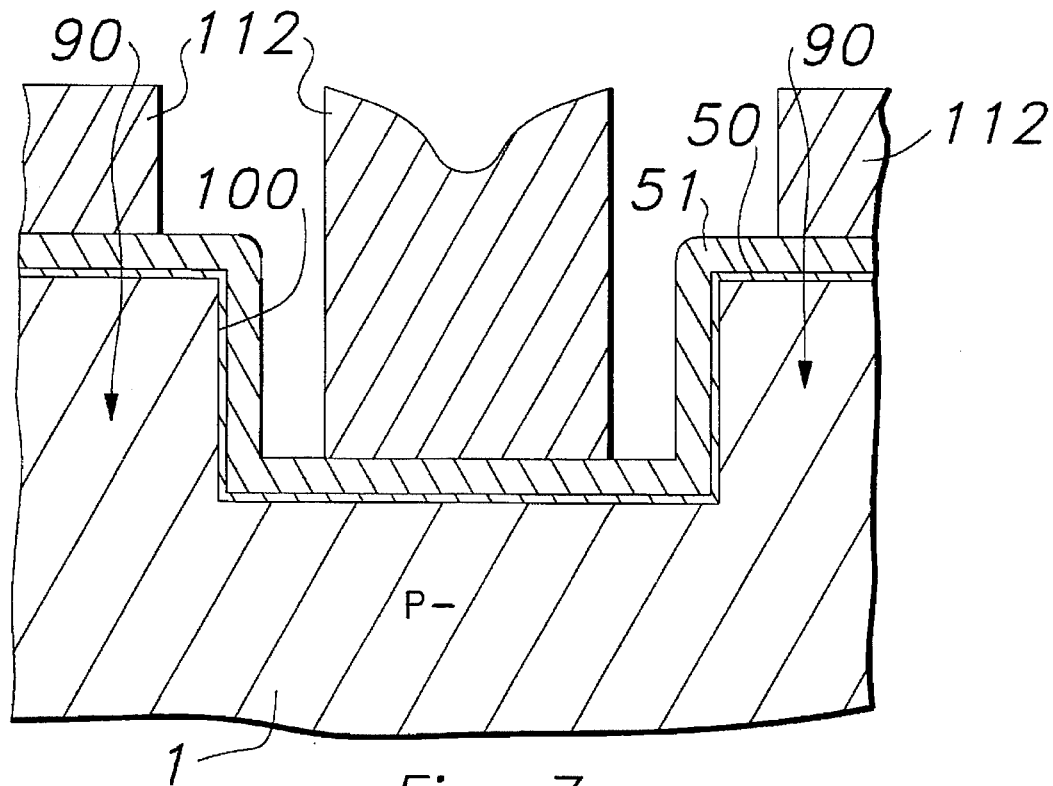
FIG. 7 is a cross section which shows a step in the method for manufacturing the aforementioned RAM in relation to the memory cells.
Figure 17:
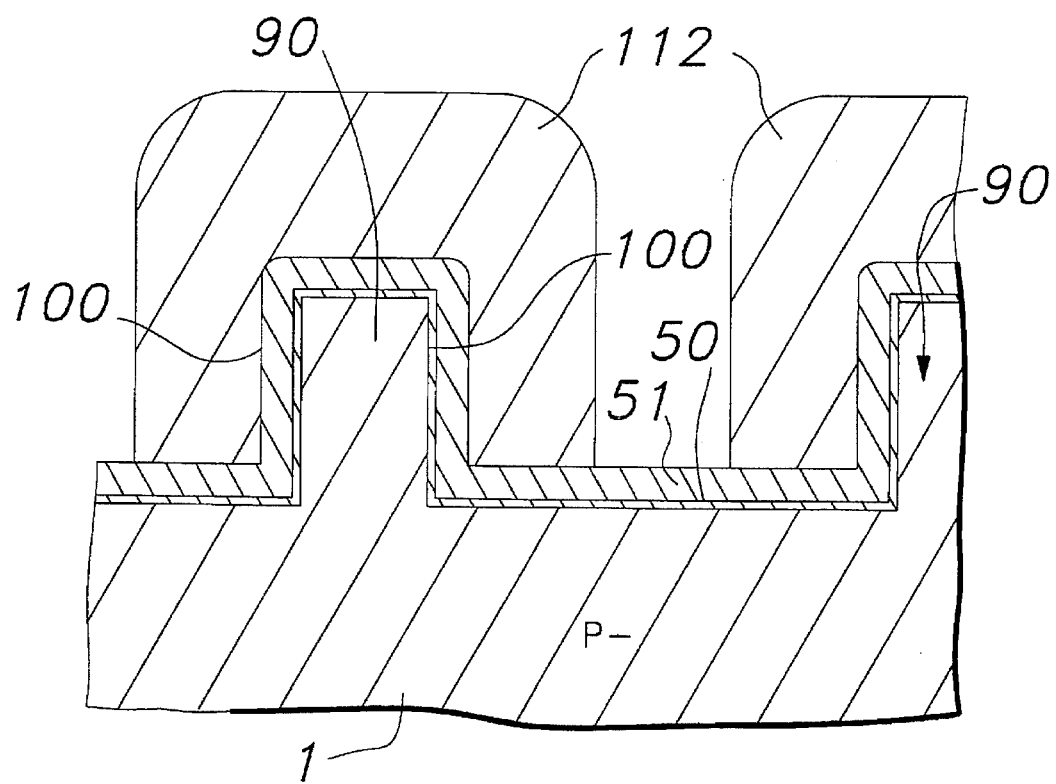
FIG. 17 is a cross section which shows a step in the method for manufacturing the aforementioned RAM in relation to the memory cells.

Next, as shown in FIG. 7 and 17, an SiO₂ layer (112) is deposited and patterned on the entire surface by CVD.

Figure 8:
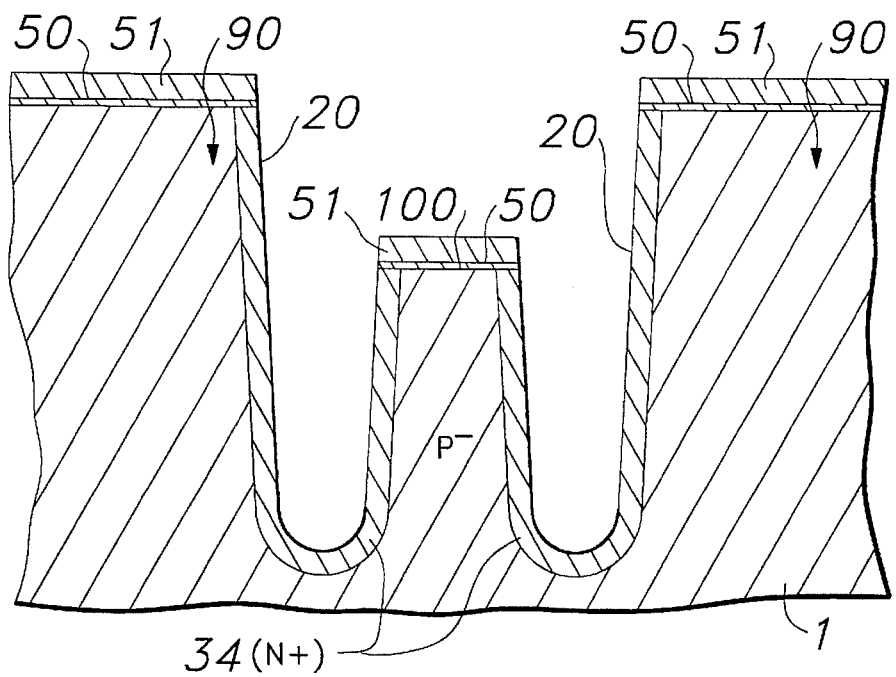
FIG. 8 is a cross section which shows a step in the method for manufacturing the aforementioned RAM in relation to the memory cells.
Figure 18:
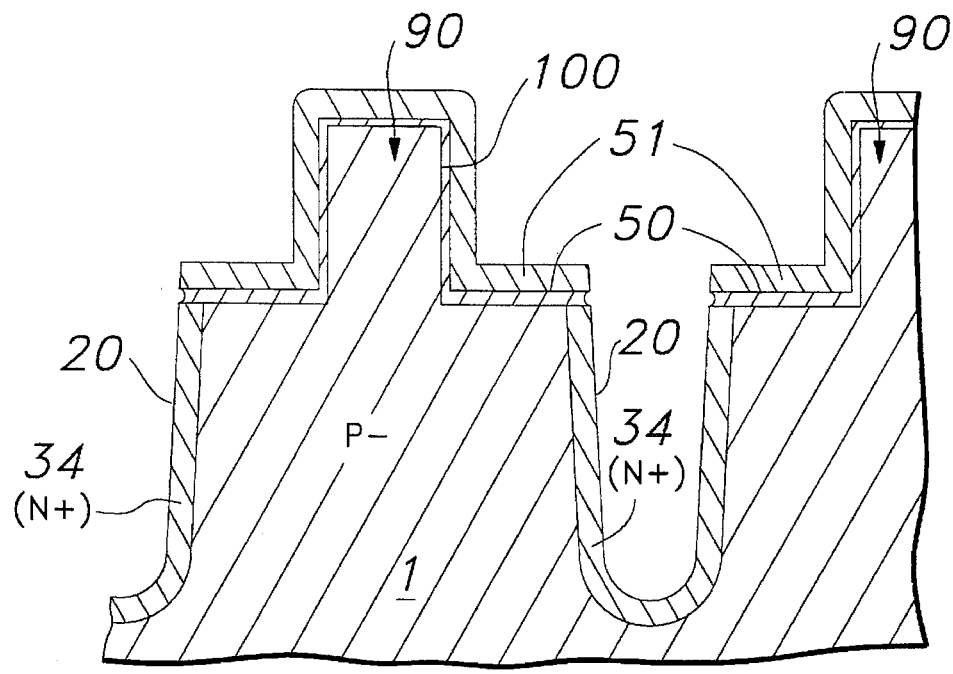
FIG. 18 is a cross section which shows a step in the method for manufacturing the aforementioned RAM in relation to the memory cells.

Next, as shown in FIGS. 8 and 18, the SiO₂ layer (112) is used as a mask in etching the Si₃N₄ film (51), SiO₂ film (50), and substrate (1), thereby forming a trench-shaped groove (20) to a depth of 3–5 μm on the substrate (1) in the memory cell unit. This groove (20) is formed such that part of it overlaps the aforementioned depression (100).

Next, a commonly known method is used to diffuse an n-type impurity (such as As) on the side walls of the groove (20), thereby forming an n⁺ diffusion area (34), which is used to store the charge of the capacitors.

Figure 9:
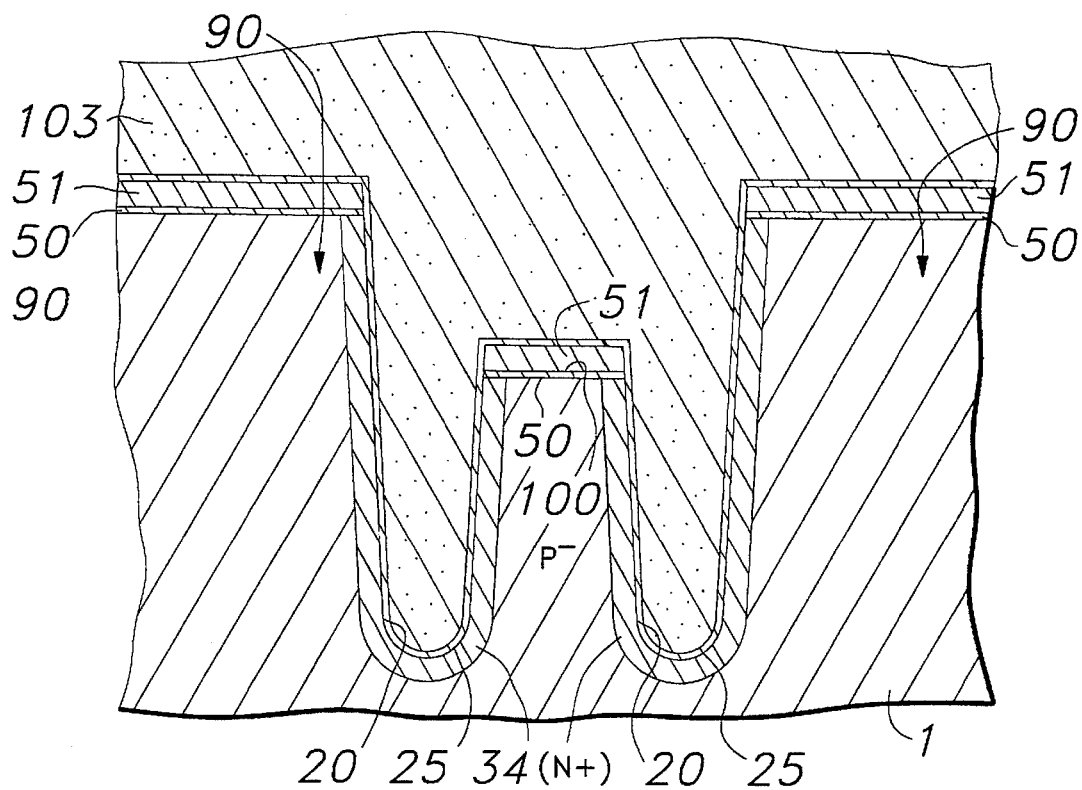
FIG. 9 is a cross section which shows a step in the method for manufacturing the aforementioned RAM in relation to the memory cells.
Figure 19:
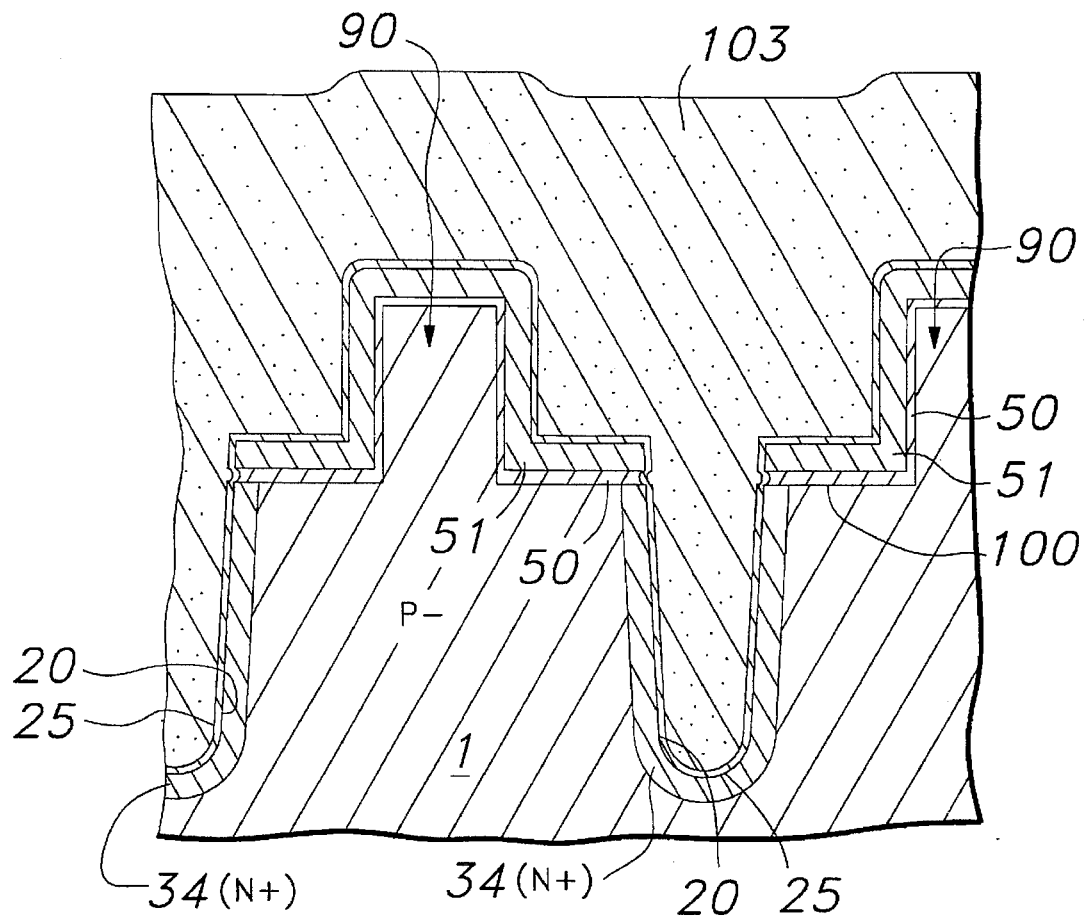
FIG. 19 is a cross section which shows a step in the method for manufacturing the aforementioned RAM in relation to the memory cells.

Next, as shown in FIGS. 9 and 19, CVD (chemical vapor deposition method) or a thermal oxidation method is used to form an SiO₂ film (25) with a thickness of approximately 100Å on the walls of the groove (20).

Next, the CVD method is used to deposit an n-type polysilicon (103) over the entire surface, including the groove (20) and depression (100). During this process, the space between the gate active areas of the memory cell unit is reduced in order to increase the degree of integration, and the surface of the polysilicon layer (103) is nearly flat.

Figure 10:
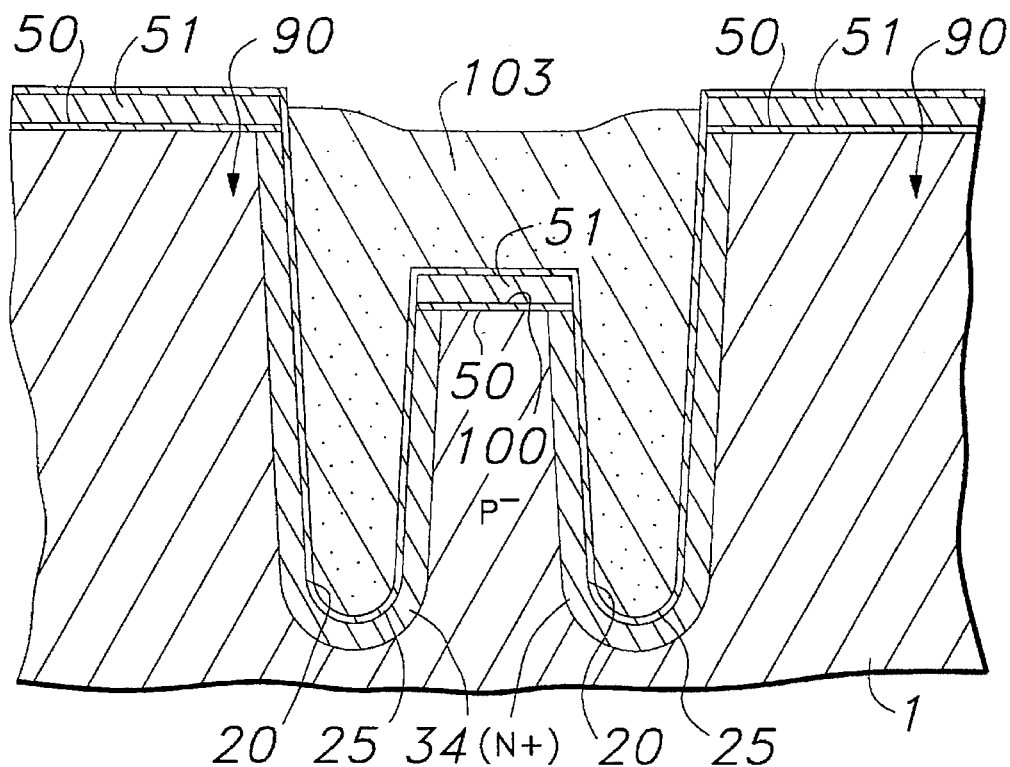
FIG. 10 is a cross section which shows a step in the method for manufacturing the aforementioned RAM in relation to the memory cells.
Figure 20:
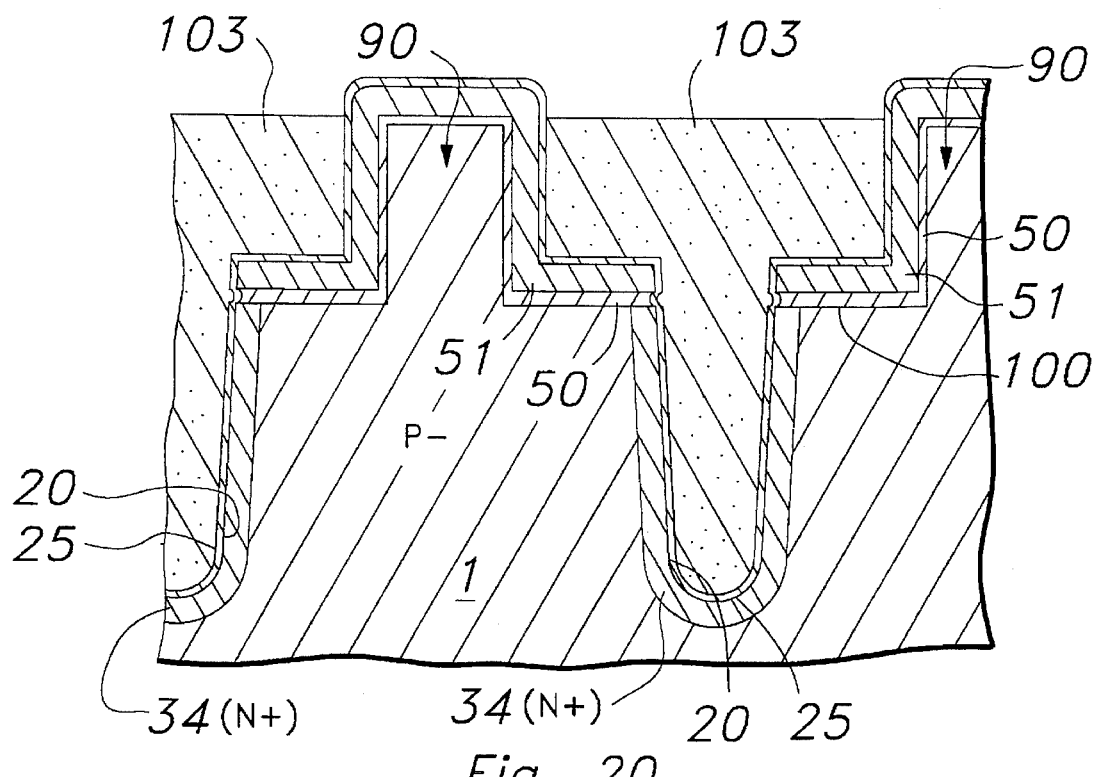
FIG. 20 is a cross section which shows a step in the method for manufacturing the aforementioned RAM in relation to the memory cells.

Next, as shown in FIGS. 10 and 20, etch back is carried out until the polysilicon on the gate active area disappears, and the polysilicon layer (103) is buried in an area away from the gate active area (90). The polysilicon layer (103) is buried at a level lower than the uppermost surface on the front side of the substrate (1) (i.e., the surface of (25) on the film (51)).

Figure 11:
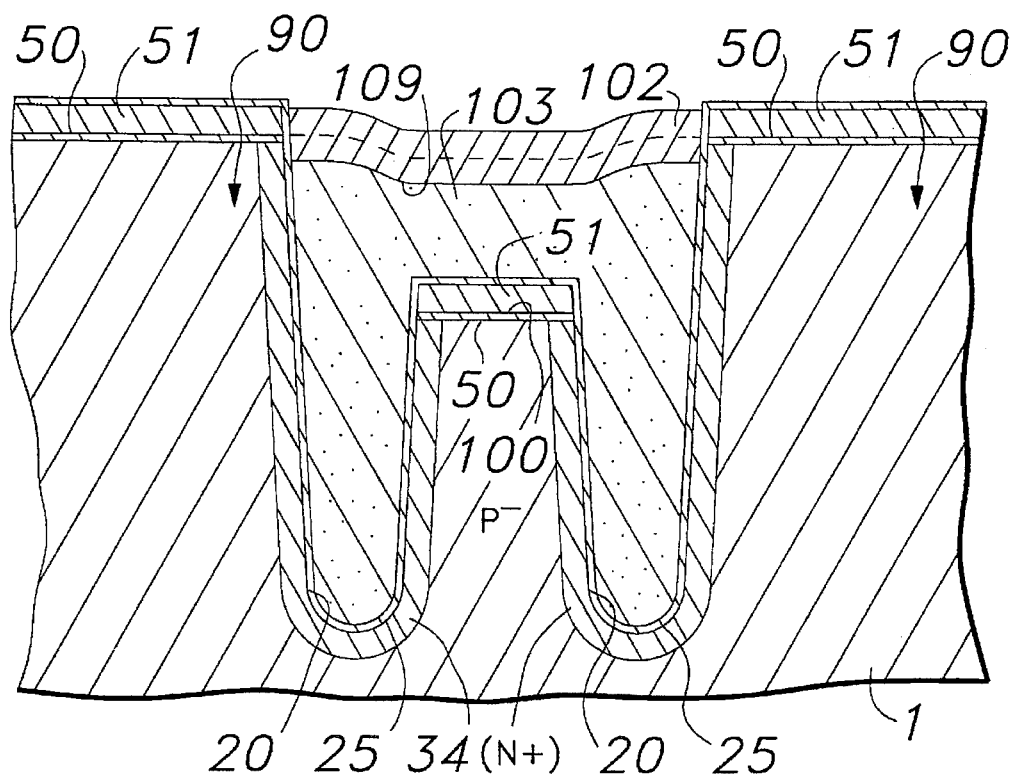
FIG. 11 is a cross section which shows a step in the method for manufacturing the aforementioned RAM in relation to the memory cells.
Figure 21:
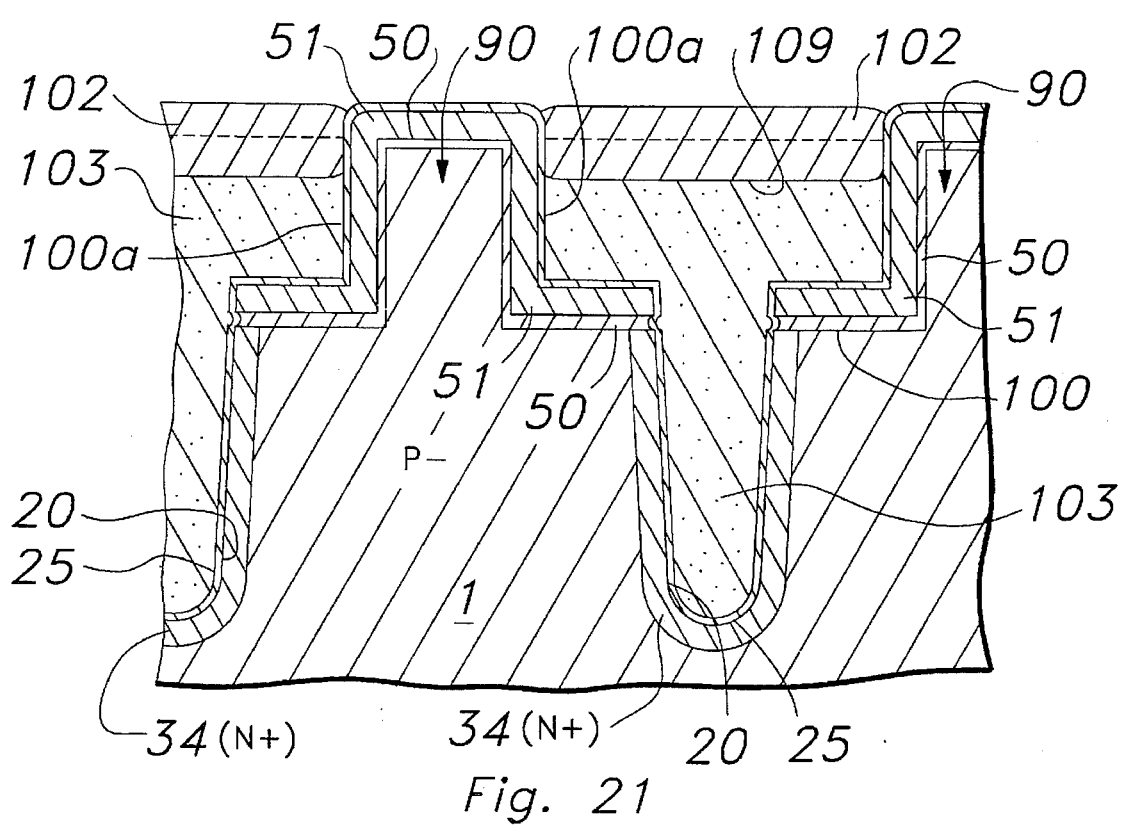
FIG. 21 is a cross section which shows a step in the method for manufacturing the aforementioned RAM in relation to the memory cells.

Next, as shown in FIGS. 11 and 21, the front surface (top) of the polysilicon layer (103) is given an oxidizing treatment, thereby growing the SiO₂ film (102). During this process, the upper surface of the polysilicon layer (103) is positioned below the gate active area (90) and oxidized as described above. Thus, the SiO₂ film (102) is restricted to the surrounding wall (100a) of the depression (100), and thus grows only upward without projecting horizontally. Thus, it is possible to form the field plate (103) in the desired position, and it is possible to secure the gate active area (90).

Figure 12:
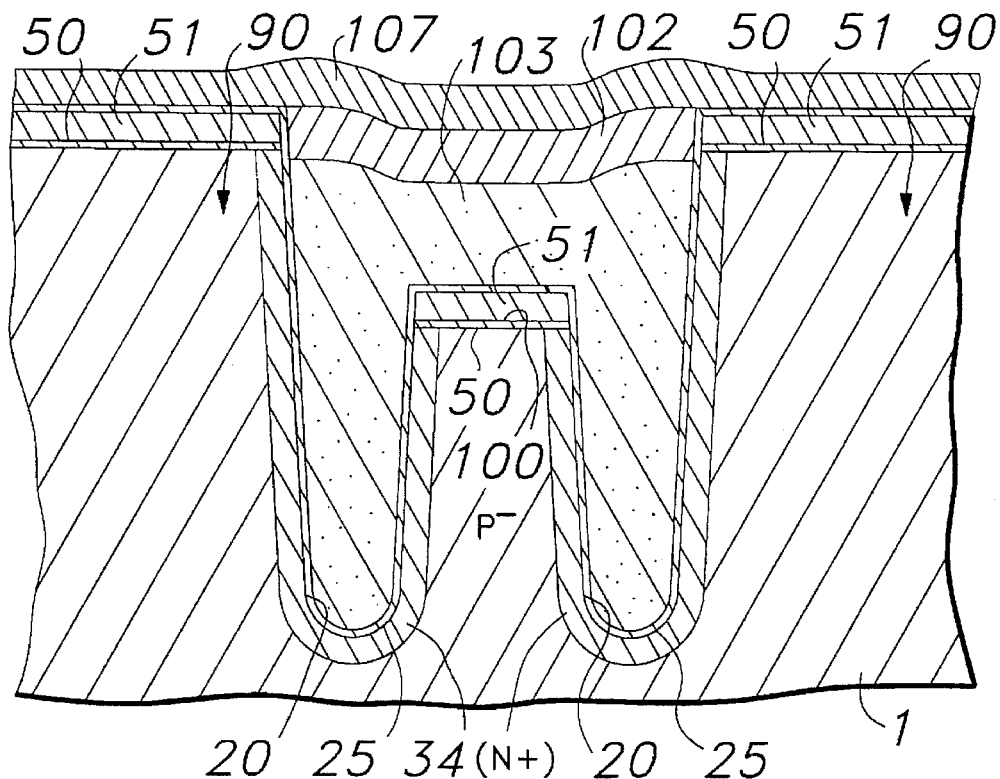
FIG. 12 is a cross section which shows a step in the method for manufacturing the aforementioned RAM in relation to the memory cells.
Figure 22:
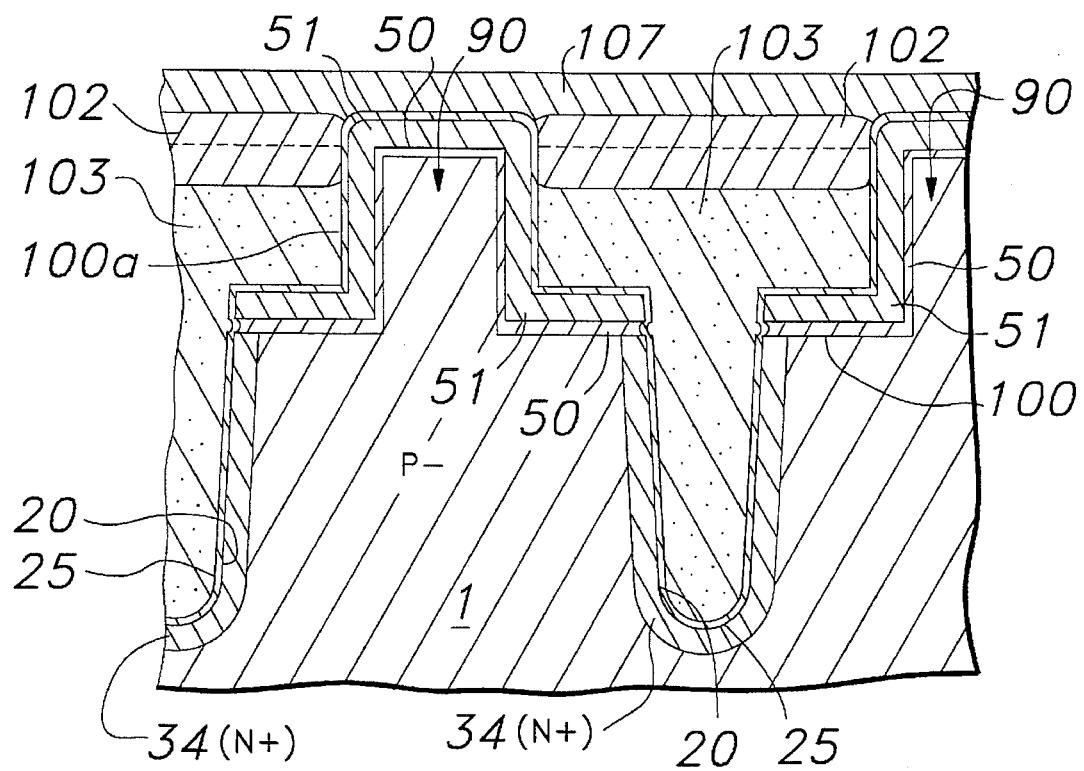
FIG. 22 is a cross section which shows a step in the method for manufacturing the aforementioned RAM in relation to the memory cells.

Next, as shown in FIGS. 12 and 22, an Si₃N₄ film (107) is deposited.

Figure 13:
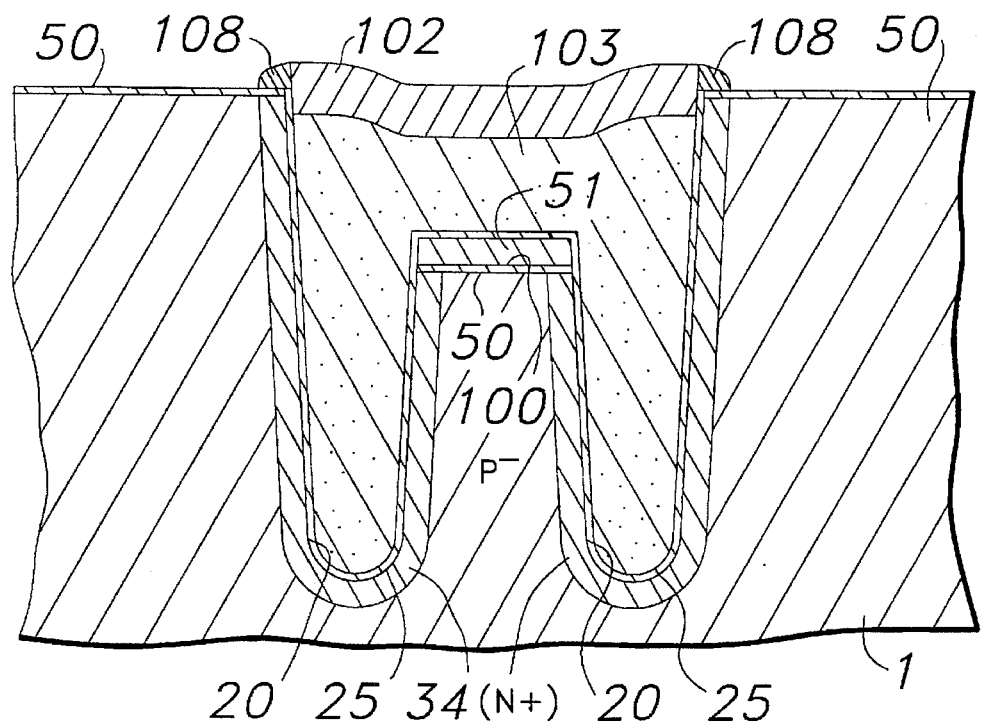
FIG. 13 is a cross section which shows a step in the method for manufacturing the aforementioned RAM in relation to the memory cells.
Figure 23:
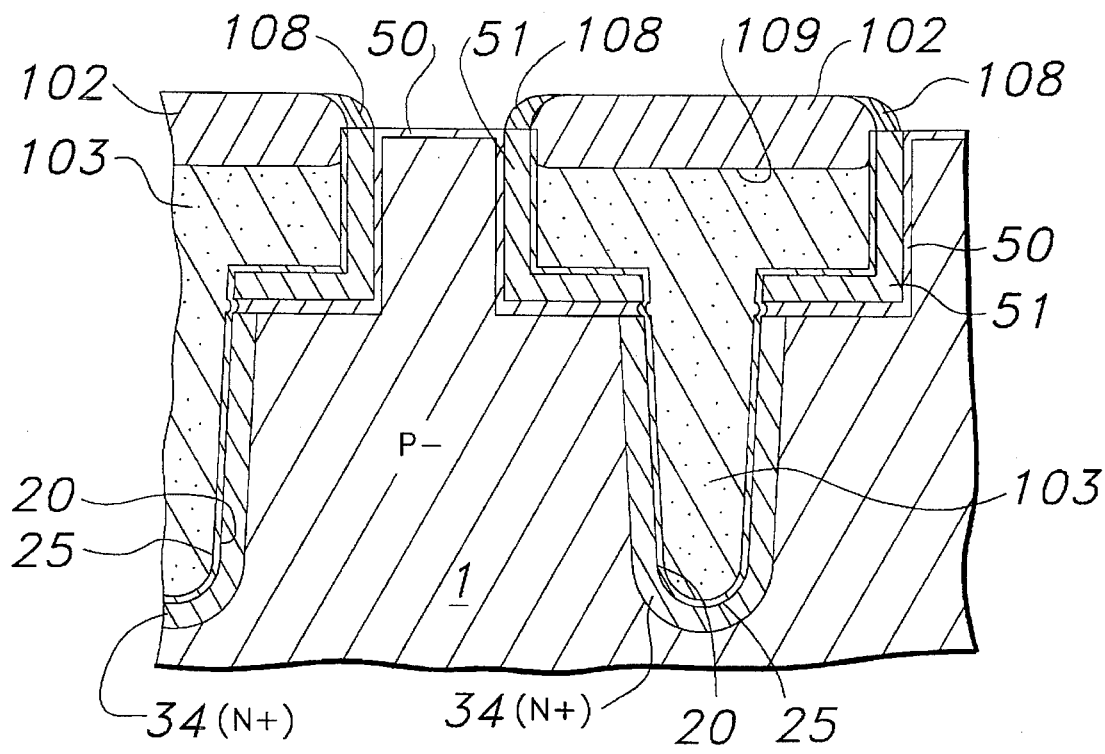
FIG. 23 is a cross section which shows a step in the method for manufacturing the aforementioned RAM in relation to the memory cells.

Next, as shown in FIGS. 13 and 23, this Si₃N₄ film is etched back to selectively adhere a film (108), in which Si₃N₄ is the main component, to the SiO₂ film (102). Thus, it is possible to prevent short-circuiting between the word lines since the SiO₂ film (102) retains the polysilicon which is adhered during the polysilicon gate formation (see FIG. 4). In addition, it is possible to position the gate active area (90) precisely.

Figure 14:
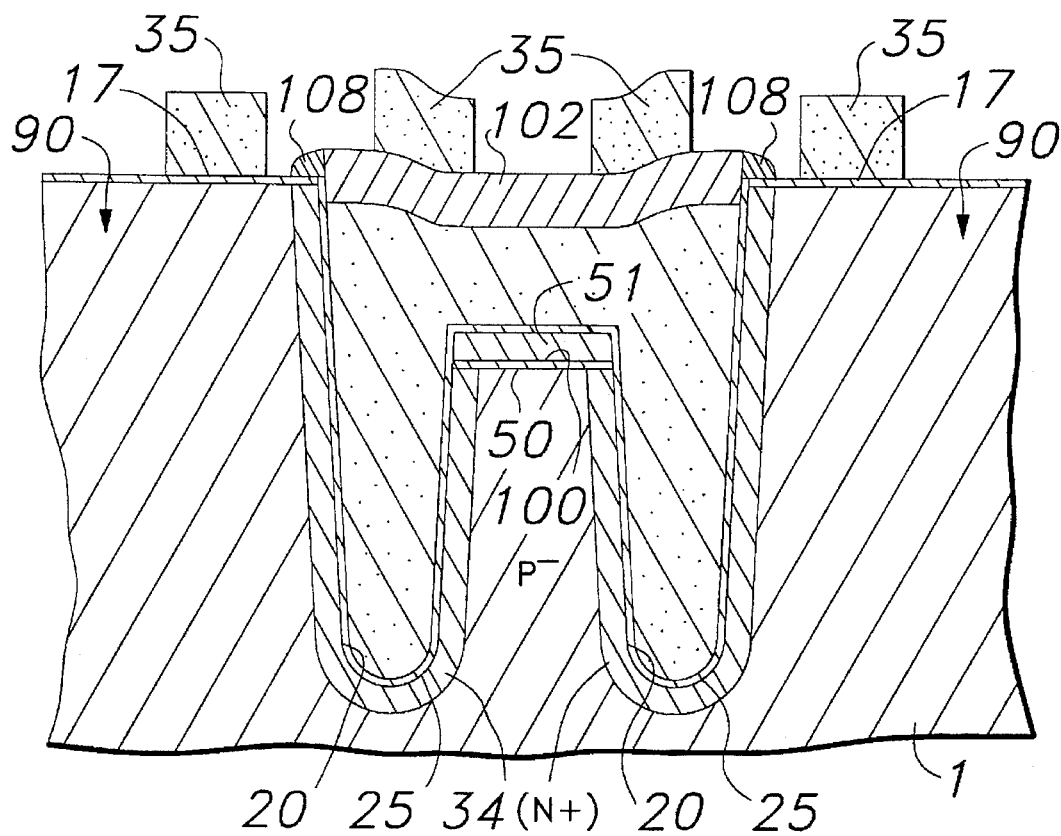
FIG. 14 is a cross section which shows a step in the method for manufacturing the aforementioned RAM in relation to the memory cells.
Figure 24:
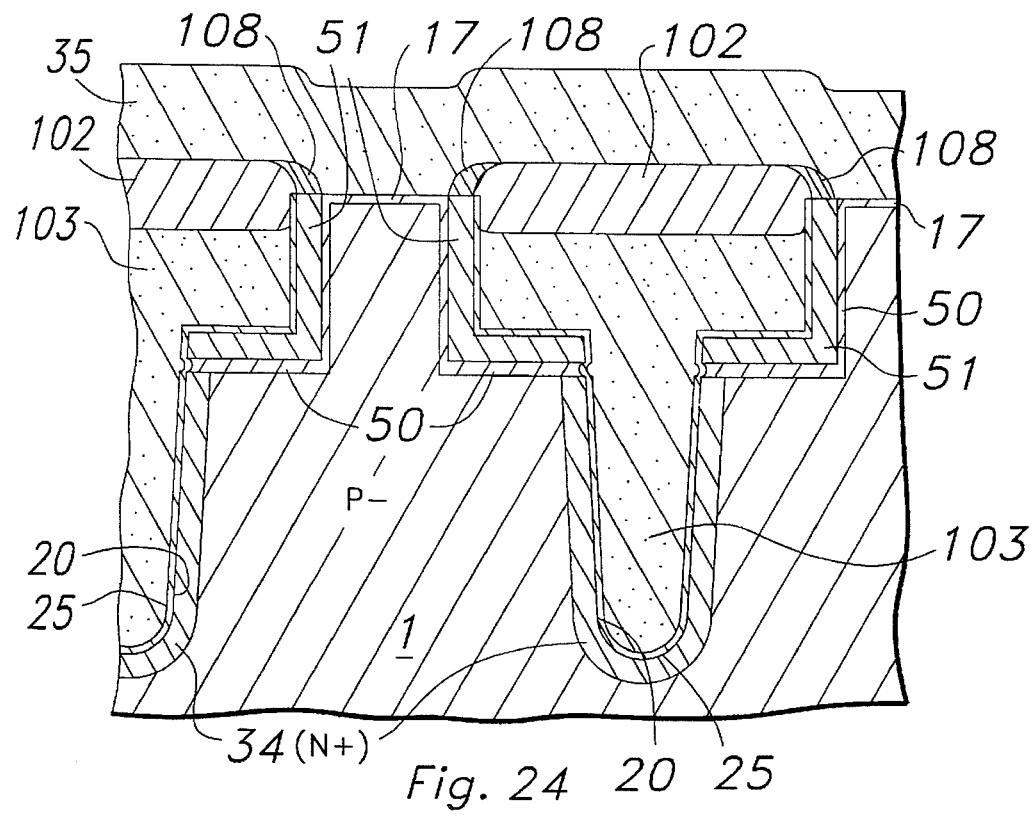
FIG. 24 is a cross section which shows a step in the method for manufacturing the aforementioned RAM in relation to the memory cells.

Next, as shown in FIGS. 14 and 24, the SiO₂ film located in the gate active area (90) is removed by etching, after which a thermal oxidation method is used to grow the gate oxide film (17), on top of which a polysilicon is grown by CVD, then etched and patterned to form polysilicon gates (35).

Next, n-type impurity ions (such as As) are injected using the polysilicon gates (35) as masks, thereby forming n$^+$ diffusion areas (22), (23), and (33) inside the substrate (1) to be self aligning. Next, a contact hole is formed in the SiO$_2$ film (53), which has been deposited by CVD over the entire surface. Next, the bit line material is deposited and patterned to form the bit line (41) (see FIGS. 1 and 2).

With the manufacturing method described above, the depression (100) and the groove (20), which extends onto one part of this depression, are linked on the substrate (1). Next, the polysilicon field plate (103) is buried in them, and said polysilicon is oxidized to form an oxide film (102). Thus, the oxide film (102) is restricted to the surrounding wall (100a) of the depression (100), thereby preventing it from projecting out horizontally, and allowing it to grow upward only. Therefore, it is possible to form the field plate (103) in the desired position and it is possible to secure the gate active area (90).

Thus, even after oxidation, the aforementioned buried polysilicon (103) has a sufficiently large cross section area. Thus, line cutting does not occur, and it is even possible to reduce the level difference between the oxide film (102) and gate active area (90), thereby making it possible to flatten the surface.

FIGS. 25-30 show a dynamic RAM (such as a 64 megabite type) which is the second embodiment of the present invention.

Figure 25:
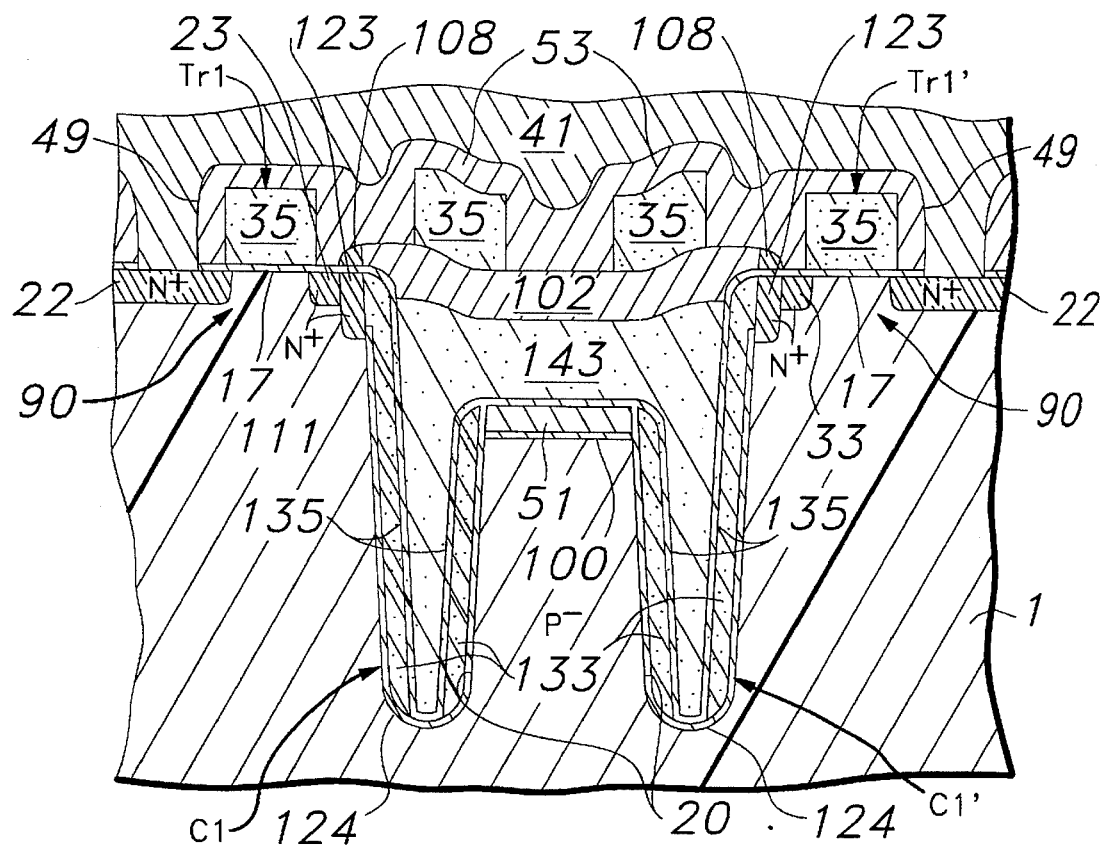
FIG. 25 is a cross section of the major parts of memory cells in the dynamic RAM of the second embodiment of the present invention.

The memory cells of this RAM are the so-called STT (stack in trench) type. As shown in FIG. 25, an insulating film (SiO$_2$ film) (124) is formed to a thickness of approximately 1000Å over the entire wall surface of the trench-shaped groove (20) except for its top. An n$^+$-type diffusion area (123) is then formed in this top area, where the insulating film is not present, to be linked with the source areas (23) and (33) of the transfer gates Tr$_1$ and Tr$_1$'.

Next, the n diffusion area (123) is connected to an n$^+$-type polysilicon electrode (133), which is deposited to the wall surface of the insulating film (124). During this process, the diffusion area (123) is formed by the automatically doping of impurities from the polysilicon electrode (133).

The capacitors C$_1$ and C$_1$' are constructed with an n$^+$-type polysilicon electrode (133)-SiO$_2$ film (135)-n$^+$-type polysilicon electrode (143). The other structures are the same as in FIG. 1. In the figures, (142) is a polysilicon oxide layer.

The characteristics of the STT cell thus produced will now be explained with in relation to the manufacturing method shown in FIGS. 26-30.

Figure 26:
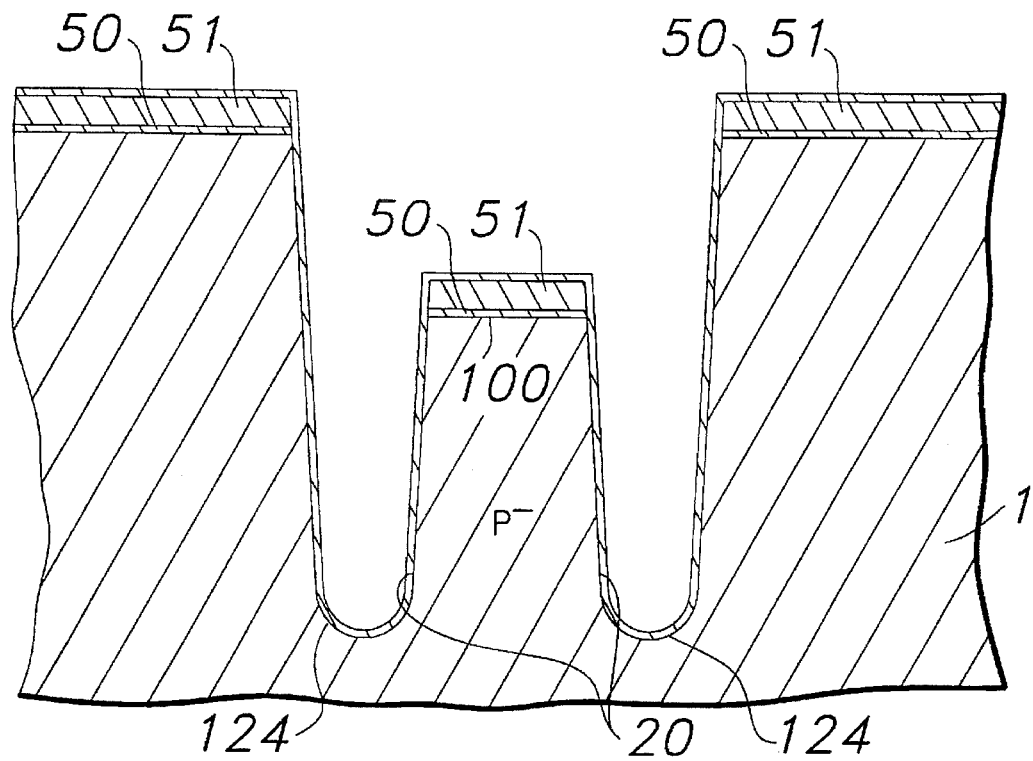
FIG. 26 is a cross section which shows a step in the method for manufacturing the aforementioned RAM in relation to the memory cells.

As shown in FIG. 26, the depression (100) and a groove (20) which is continuous with it are formed on the substrate (1). Next, the SiO$_2$ film (124), having a thickness of approximately 1000Å, is formed on the wall surface by CVD or a thermal oxidation method.

Figure 27:
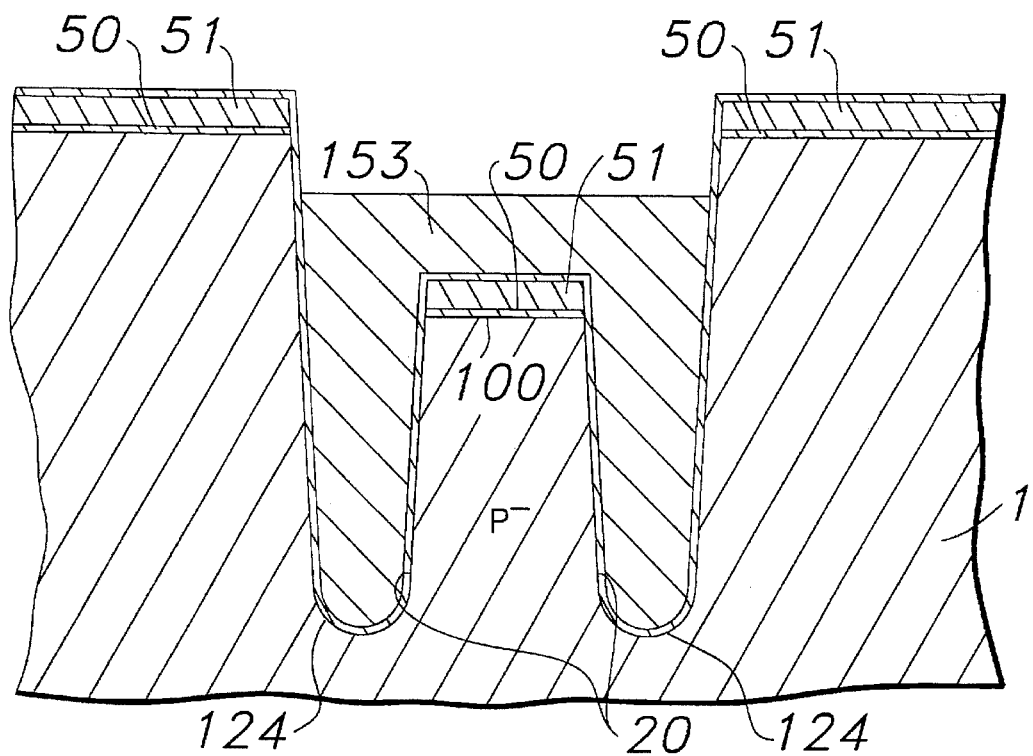
FIG. 27 is a cross section which shows a step in the method for manufacturing the aforementioned RAM in relation to the memory cells.

Next, as shown in FIG. 27, a photoresist (153) is covered to the entire surface, filling the groove (20) and depression (100), after which it is etched back and allowed to remain in the groove (20) and depression (100) at the prescribed depth level. Next, this photoresist (153) is used as a mask in etching the SiO$_2$ film (124), thereby forming an empty area (124a) for the side contact.

Figure 28:
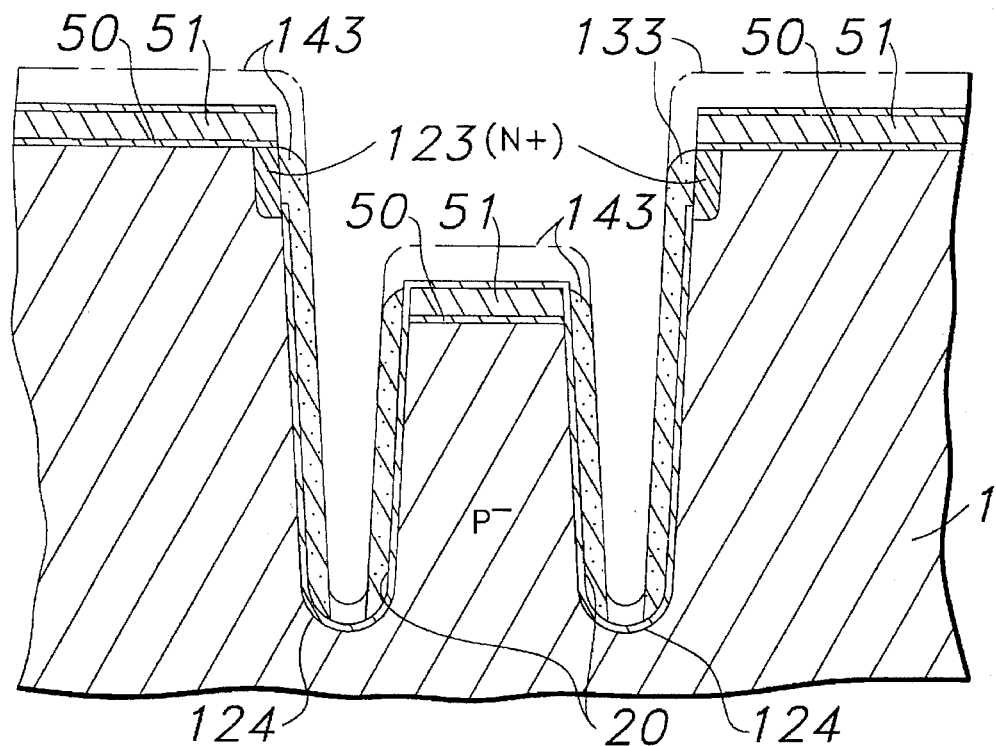
FIG. 28 is a cross section which shows a step in the method for manufacturing the aforementioned RAM in relation to the memory cells.

Next, as shown in FIG. 28, CVD is used to deposit the storage polysilicon layer (133) on the entire surface to a thickness of approximately 500Å, as shown by the alternate long and short dash line. Next, annealing is performed, thereby automatically doping to the silicon surface area with n-type impurities from the polysilicon film (143) in the side contact area, to form the n$^+$-type diffusion area (123).

Next, as shown in FIG. 28, the polysilicon film (133) is etched back by RIE dry etching to remove the area indicated by the alternate long and short dash line, leaving the remainder as a storage node.

Figure 29:
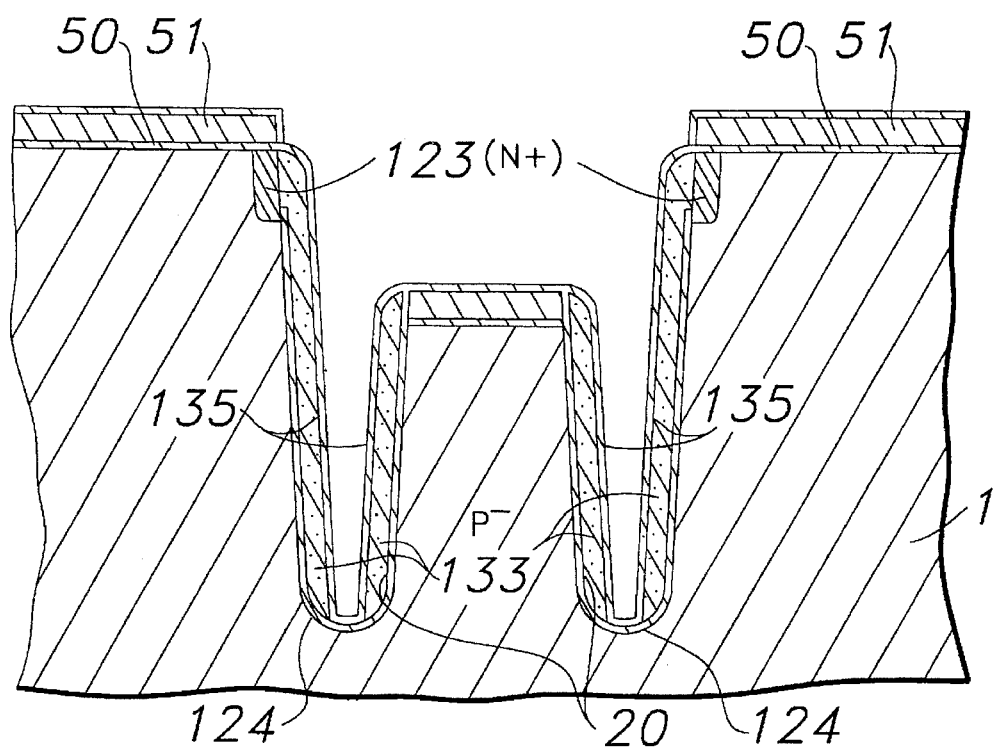
FIG. 29 is a cross section which shows a step in the method for manufacturing the aforementioned RAM in relation to the memory cells.

Next, as shown in FIG. 29, CVD is used to grow an SiO$_2$ film (135) over the entire surface (including the inside of the groove (20)).

Figure 30:
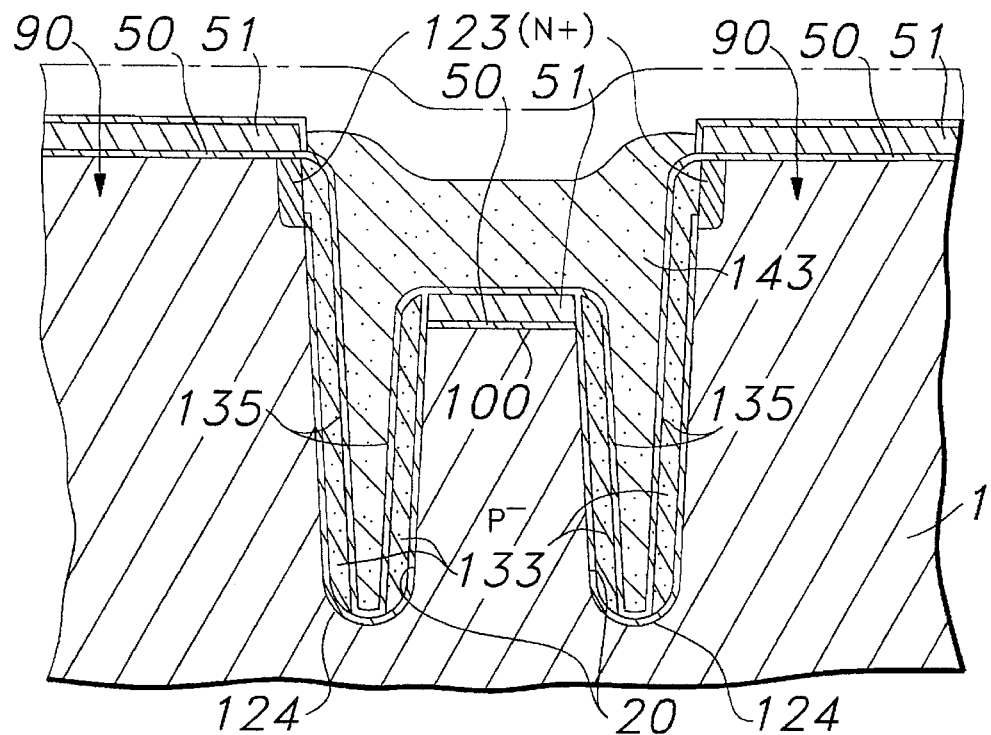
FIG. 30 is a cross section which shows a step in the method for manufacturing the aforementioned RAM in relation to the memory cells.

Next, as shown in FIG. 30, CVD is used to deposit a polysilicon layer (143) over the entire surface, including the groove (20) and depression (100), after which the area indicated by the alternate long and short dash line is etched back by RIE dry etching in the same manner as above up to the top of the groove (20).

Next, as shown in FIG. 25, a thermal oxidation technology is used to oxidized the surface of the polysilicon layer (143), thereby growing an SiO$_2$ layer (142). The following processes will not be explained since they are the same as those described above.

Thus, even with STT cells, the oxide (142) of the polysilicon layer (143) is prevented from projecting horizontally by the depression (100), which is situated to be linked with the groove (20). Thus, it is possible to form the desired gate active area (90) at all times according to designs. In addition, in the same manner as the aforementioned embodiment, it is possible to obtain the effects of a flattened surface and prevention of line cutting on the field plate.

The present invention has thus been explained in relation to embodiments. However, it is also possible to make a variety of alterations in the above application examples, based on the technological ideas of the present invention.

For example, it is possible to make a variety of alterations in the patterns, range, etc. of the aforementioned depression (100). In addition, formation method is not restricted to the aforementioned examples. The groove (20) may also be entirely contained in the depression (100).

In addition, it is also possible to use conductive materials other than polysilicon as the material for the aforementioned field plate.

Although a nitride was situated below the field plate to isolate the elements in the aforementioned examples, it is also possible to use an SiO$_2$ alone, in the same manner as a LOCOS structure.

It is also possible to make a variety of alterations in the materials, etc. of the aforementioned areas, and it is also possible to reverse the conductive types of the semiconductor areas.

The present invention can of course be applied to semiconductor integrated circuit elements other than dynamic RAMs which have the structure described above.

As described above, with the present invention, a conductor is buried in a first and second depression, on top of which an insulating film is then formed, the bottom of which insulating film is formed inside of the first depression. Thus, it is possible to prevent the insulating film from projecting horizontally during the insulating film formation procedure. As a result, in the following procedures, it is possible to form Si$_3$N$_4$, etc. according to designs using a side wall technology, thereby making it possible to secure the element active area according to designs.

In addition, since the aforementioned conductor is buried inside the first and second depressions, it can be allowed to remain by etching back without patterning by etching. Thus, the conductor is continuous over a sufficiently large cross section area, even if its top is converted to an insulator, thereby preventing short-circuits.

In addition, since there is not a large difference in level between the aforementioned insulating film and element active area, it is possible to flatten the surface in comparison with the conventional structure, wiring formation is made simpler, and it is possible to prevent the problems of wiring cutting.

What we claim is:

1. A semiconductor storage device comprising:

a semiconductor substrate of a first conductive type;

a first groove provided in this one conductive type semiconductor substrate;

a second groove deeper than the first groove provided so as to be stacked within said first groove;

a MOS transistor which include first and second regions of a second conductive type, said second conductive type being opposite said first conductive type;

an accumulating electrode connected to said first region of said MOS transistor, said accumulating electrode being disposed in said second groove and separated from said second groove by an insulating film; and an electrode provided on said accumulating electrode and separated therefrom by a capacitor insulating film, said electrode buried in said first and second grooves.

2. The device of claim 1 and further comprising an insulating film formed on top of said electrode at an interface wherein said interface is formed inside said first depression below a top surface of said semiconductor substrate.

3. The device of claim 1 wherein:

said semiconductor substrate comprises a silicon substrate; and said electrode and said accumulating electrode comprise polysilicon electrodes.

4. The device of claim 1 wherein said insulating film comprises a silicon dioxide film.

5. The device of claim 1 wherein said capacitor insulating film comprise silicon dioxide.

6. A semiconductor storage device characterized by the fact that it is equipped with a semiconductor substrate of one conductive type, a first groove provided in this one conductive type semiconductor substrate, a second groove deeper than the first groove provided so as to be stacked with this first groove, a MOS transistor that has a pair of regions of the opposite conductive type on the top of the aforementioned substrate, an accumulating electrode connected to one of the aforementioned pair of opposite conductive type regions and provided in the aforementioned groove separated by an insulating film, and an electrode provided on this accumulating electrode separated by a capacitor insulating film and buried in the aforementioned first and second grooves.

* * * * *